(12) United States Patent
Rothberg et al.

(10) Patent No.: US 9,476,969 B2
(45) Date of Patent: *Oct. 25, 2016

(54) ARCHITECTURE OF SINGLE SUBSTRATE ULTRASONIC IMAGING DEVICES, RELATED APPARATUSES, AND METHODS

(71) Applicant: Butterfly Network, Inc., Guilford, CT (US)

(72) Inventors: Jonathan M. Rothberg, Guilford, CT (US); Tyler S. Ralston, Clinton, CT (US); Nevada J. Sanchez, Guilford, CT (US); Andrew J. Casper, Clinton, CT (US)

(73) Assignee: Butterfly Network, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,837

(22) Filed: Nov. 13, 2015

(65) Prior Publication Data

US 2016/0069989 A1 Mar. 10, 2016

Related U.S. Application Data

(63) Continuation of application No. 14/689,090, filed on Apr. 17, 2015, now Pat. No. 9,229,097.

(60) Provisional application No. 61/981,469, filed on Apr. 18, 2014.

(51) Int. Cl.
*G01S 7/00* (2006.01)
*G01S 7/52* (2006.01)
*H03K 5/13* (2014.01)
*G10K 11/34* (2006.01)

(Continued)

(52) U.S. Cl.
CPC ........ *G01S 7/52019* (2013.01); *G01S 7/52017* (2013.01); *G10K 11/346* (2013.01); *H03K 5/13* (2013.01); *B06B 1/0607* (2013.01); *G01S 7/5202* (2013.01); *H03K 2005/00019* (2013.01)

(58) Field of Classification Search
USPC ...................................................... 367/117
See application file for complete search history.

(56) References Cited

U.S. PATENT DOCUMENTS 4,594,662 A 6/1986 Devaney
5,269,307 A 12/1993 Fife et al.

(Continued)

FOREIGN PATENT DOCUMENTS

WO WO 2007/095499 A2 8/2007
WO WO 2007/096636 A1 8/2007

(Continued)

OTHER PUBLICATIONS

Invitation to Pay Additional Fees mailed Jul. 2, 2014 for Application No. PCT/US2014/025567.

(Continued)

*Primary Examiner* — James Hulka
(74) *Attorney, Agent, or Firm* — Wolf, Greenfield & Sacks, P.C.

(57) ABSTRACT

Aspects of the technology described herein relate to ultrasound device circuitry as may form part of a single substrate ultrasound device having integrated ultrasonic transducers. The ultrasound device circuitry may facilitate the generation of ultrasound waveforms in a manner that is power- and data-efficient.

28 Claims, 10 Drawing Sheets

(51) Int. Cl.
*H03K 5/00* (2006.01)
*B06B 1/06* (2006.01)

(56) References Cited

U.S. PATENT DOCUMENTS

| | | |
|---|---|---|
| 5,740,805 A | 4/1998 | Dolazza et al. |
| 5,782,769 A | 7/1998 | Hwang et al. |
| 5,817,024 A | 10/1998 | Ogle et al. |
| 5,893,363 A | 4/1999 | Little et al. |
| 6,126,602 A | 10/2000 | Savord et al. |
| 6,135,961 A | 10/2000 | Pflugrath et al. |
| 6,203,498 B1 | 3/2001 | Bunce et al. |
| 6,241,676 B1 | 6/2001 | Savord |
| D456,509 S | 4/2002 | Schultz |
| 6,364,839 B1 | 4/2002 | Little et al. |
| 6,371,918 B1 | 4/2002 | Bunce |
| 6,383,139 B1 | 5/2002 | Hwang et al. |
| 6,416,475 B1 | 7/2002 | Hwang et al. |
| D461,895 S | 8/2002 | Barnes et al. |
| 6,430,109 B1 | 8/2002 | Khuri-Yakub et al. |
| 6,443,901 B1 | 9/2002 | Fraser |
| 6,447,451 B1 | 9/2002 | Wing et al. |
| 6,471,651 B1 | 10/2002 | Hwang et al. |
| 6,569,101 B2 | 5/2003 | Quistgaard et al. |
| 6,575,908 B2 | 6/2003 | Barnes et al. |
| 6,604,630 B1 | 8/2003 | Cabatic et al. |
| 6,632,178 B1 | 10/2003 | Fraser |
| 6,645,145 B1 | 11/2003 | Dreschel et al. |
| 6,648,826 B2 | 11/2003 | Little et al. |
| 6,659,954 B2 | 12/2003 | Robinson |
| 6,694,817 B2 | 2/2004 | Degertekin et al. |
| 6,795,374 B2 | 9/2004 | Barnes et al. |
| 6,831,294 B1 | 12/2004 | Nishimura et al. |
| 6,831,394 B2 | 12/2004 | Baumgartner et al. |
| 6,835,177 B2 | 12/2004 | Fritz et al. |
| 6,865,140 B2 | 3/2005 | Thomenius et al. |
| 6,880,137 B1 | 4/2005 | Burlison et al. |
| 6,958,255 B2 | 10/2005 | Khuri-Yakub et al. |
| 6,962,566 B2 | 11/2005 | Quistgaard et al. |
| 6,974,417 B2 | 12/2005 | Lockwood et al. |
| 7,030,536 B2 | 4/2006 | Smith et al. |
| 7,037,746 B1 | 5/2006 | Smith et al. |
| 7,052,464 B2 | 5/2006 | Wodnicki |
| 7,125,383 B2 | 10/2006 | Hoctor et al. |
| 7,257,051 B2 | 8/2007 | Thomenius et al. |
| 7,280,435 B2 | 10/2007 | Thomenius et al. |
| 7,285,897 B2 | 10/2007 | Fisher et al. |
| 7,293,462 B2 | 11/2007 | Lee et al. |
| D558,351 S | 12/2007 | Diener et al. |
| 7,303,530 B2 | 12/2007 | Barnes et al. |
| 7,313,053 B2 | 12/2007 | Wodnicki |
| 7,353,056 B2 | 4/2008 | Hazard et al. |
| 7,375,420 B2 | 5/2008 | Fisher et al. |
| 7,408,283 B2 | 8/2008 | Smith et al. |
| 7,425,199 B2 | 9/2008 | Hoctor et al. |
| 7,441,321 B2 | 10/2008 | Baumgartner et al. |
| 7,441,447 B2 | 10/2008 | Degertekin et al. |
| 7,443,765 B2 | 10/2008 | Thomenius et al. |
| 7,449,640 B2 | 11/2008 | Coleman |
| 7,451,651 B2 | 11/2008 | Woychik et al. |
| 7,470,232 B2 | 12/2008 | Hoctor et al. |
| 7,497,828 B1 | 3/2009 | Wilk et al. |
| D591,423 S | 4/2009 | Diener et al. |
| 7,530,952 B2 | 5/2009 | Huang et al. |
| 7,534,211 B2 | 5/2009 | Hwang et al. |
| 7,545,012 B2 | 6/2009 | Smith et al. |
| 7,546,769 B2 | 6/2009 | Ramaswamy et al. |
| 7,549,961 B1 | 6/2009 | Hwang |
| 7,549,962 B2 | 6/2009 | Dreschel et al. |
| 7,564,172 B1 | 7/2009 | Huang |
| 7,597,665 B2 | 10/2009 | Wilk et al. |
| 7,604,596 B2 | 10/2009 | Hwang et al. |
| 7,612,483 B2 | 11/2009 | Degertekin |
| 7,612,635 B2 | 11/2009 | Huang |
| 7,615,834 B2 | 11/2009 | Khuri-Yakub et al. |
| 7,622,848 B2 | 11/2009 | Lee et al. |
| 7,646,133 B2 | 1/2010 | Degertekin |
| 7,686,766 B2 | 3/2010 | Quistgaard et al. |
| 7,687,976 B2 | 3/2010 | Haider et al. |
| 7,740,586 B2 | 6/2010 | Hwang et al. |
| 7,745,248 B2 | 6/2010 | Park et al. |
| 7,759,839 B2 | 7/2010 | Huang |
| 7,764,003 B2 | 7/2010 | Huang |
| 7,775,979 B2 | 8/2010 | Thomenius et al. |
| 7,779,696 B2 | 8/2010 | Huang |
| 7,809,400 B1 | 10/2010 | Hwang |
| 7,819,807 B2 | 10/2010 | Barnes et al. |
| 7,824,335 B2 | 11/2010 | Wodnicki |
| 7,846,102 B2 | 12/2010 | Kupnik et al. |
| 7,867,168 B2 | 1/2011 | Little et al. |
| 7,878,977 B2 | 2/2011 | Mo et al. |
| 7,880,565 B2 | 2/2011 | Huang |
| 7,883,466 B2 | 2/2011 | Adachi et al. |
| 7,888,709 B2 | 2/2011 | Lemmerhirt et al. |
| 7,892,176 B2 | 2/2011 | Wodnicki et al. |
| 7,898,905 B2 | 3/2011 | Wodnicki et al. |
| 7,952,260 B2 | 5/2011 | Haider et al. |
| 7,954,387 B1 | 6/2011 | Furlong |
| 7,955,264 B2 | 6/2011 | Mathew et al. |
| 7,956,510 B2 | 6/2011 | Huang |
| 7,978,461 B2 | 7/2011 | Diener et al. |
| 7,996,688 B2 | 8/2011 | Little et al. |
| 8,004,373 B2 | 8/2011 | Huang |
| 8,008,105 B2 | 8/2011 | Huang |
| 8,008,835 B2 | 8/2011 | Degertekin |
| 8,018,301 B2 | 9/2011 | Huang |
| 8,038,620 B2 | 10/2011 | Lee et al. |
| 8,052,606 B2 | 11/2011 | Barnes et al. |
| 8,066,642 B1 | 11/2011 | Little et al. |
| 8,105,941 B2 | 1/2012 | Huang |
| 8,120,229 B2 | 2/2012 | Huang |
| 8,128,050 B1 | 3/2012 | Sliger |
| 8,133,182 B2 | 3/2012 | Wagner |
| 8,137,278 B2 | 3/2012 | Lundberg et al. |
| D657,361 S | 4/2012 | Goodwin et al. |
| 8,176,787 B2 | 5/2012 | Haider et al. |
| 8,199,685 B2 | 6/2012 | Hwang |
| 8,203,912 B2 | 6/2012 | Roest et al. |
| 8,213,467 B2 | 7/2012 | Little et al. |
| 8,216,146 B2 | 7/2012 | Hwang et al. |
| 8,222,065 B1 | 7/2012 | Smeys et al. |
| 8,226,563 B2 | 7/2012 | Peteresen et al. |
| 8,235,907 B2 | 8/2012 | Wilk et al. |
| 8,237,601 B2 | 8/2012 | Dunbar et al. |
| 8,242,665 B2 | 8/2012 | Robinson et al. |
| 8,247,945 B2 | 8/2012 | Huang |
| 8,298,144 B2 | 10/2012 | Burcher |
| 8,309,428 B2 | 11/2012 | Lemmerhirt et al. |
| 8,315,125 B2 | 11/2012 | Lemmerhirt et al. |
| 8,327,521 B2 | 12/2012 | Dirksen et al. |
| 8,345,508 B2 | 1/2013 | Wodnicki et al. |
| 8,345,513 B2 | 1/2013 | Huang |
| 8,355,554 B2 | 1/2013 | Ma et al. |
| 8,363,514 B2 | 1/2013 | Huang |
| 8,372,011 B2 | 2/2013 | Degertekin |
| 8,388,544 B2 | 3/2013 | Hoctor et al. |
| 8,398,408 B1 | 3/2013 | Hansen et al. |
| 8,398,554 B2 | 3/2013 | Degertekin |
| 8,399,278 B2 | 3/2013 | Lemmerhirt et al. |
| 8,402,831 B2 | 3/2013 | Kupnik et al. |
| 8,409,095 B1 | 4/2013 | Marquis |
| 8,429,808 B2 | 4/2013 | Huang |
| 8,439,840 B1 | 5/2013 | Duffy |
| 8,451,693 B2 | 5/2013 | Nikoozadeh et al. |
| 8,461,978 B2 | 6/2013 | Garner et al. |
| 8,483,014 B2 | 7/2013 | Huang |
| 8,526,271 B2 | 9/2013 | Huang |
| 8,527,033 B1 | 9/2013 | Williams et al. |
| 8,559,274 B2 | 10/2013 | Huang |
| 8,563,345 B2 | 10/2013 | Adler et al. |
| 8,647,279 B2 | 2/2014 | Daft et al. |
| 8,658,453 B2 | 2/2014 | Lemmerhirt et al. |
| 8,672,850 B1 | 3/2014 | Miller |
| 8,689,606 B2 | 4/2014 | Schellekens et al. |

(56) References Cited

U.S. PATENT DOCUMENTS

| | | | |
|---|---|---|---|
| 8,804,457 | B2 | 8/2014 | Franchini et al. |
| 9,229,097 | B2* | 1/2016 | Rothberg ............ G01S 7/52017 |
| 2002/0177774 | A1 | 11/2002 | Hwang et al. |
| 2003/0114760 | A1 | 6/2003 | Robinson |
| 2003/0120153 | A1 | 6/2003 | Erikson |
| 2005/0020918 | A1 | 1/2005 | Wilk et al. |
| 2005/0171431 | A1 | 8/2005 | Petersen |
| 2005/0177045 | A1 | 8/2005 | Degertekin et al. |
| 2005/0228285 | A1 | 10/2005 | Huang et al. |
| 2005/0240127 | A1 | 10/2005 | Seip et al. |
| 2007/0083119 | A1 | 4/2007 | Adachi et al. |
| 2007/0239019 | A1 | 10/2007 | Richard et al. |
| 2007/0242567 | A1 | 10/2007 | Daft et al. |
| 2007/0276238 | A1 | 11/2007 | Sudol |
| 2008/0194053 | A1 | 8/2008 | Huang |
| 2008/0228077 | A1 | 9/2008 | Wilk et al. |
| 2008/0264171 | A1 | 10/2008 | Wodnicki |
| 2008/0290756 | A1 | 11/2008 | Huang |
| 2008/0296708 | A1 | 12/2008 | Wodnicki et al. |
| 2009/0048522 | A1 | 2/2009 | Huang |
| 2009/0134497 | A1 | 5/2009 | Barth et al. |
| 2009/0140606 | A1 | 6/2009 | Huang |
| 2009/0142872 | A1 | 6/2009 | Park et al. |
| 2009/0146695 | A1 | 6/2009 | Schweizer et al. |
| 2009/0250729 | A1 | 10/2009 | Lemmerhirt et al. |
| 2010/0063397 | A1 | 3/2010 | Wagner |
| 2010/0152587 | A1 | 6/2010 | Haider et al. |
| 2010/0191894 | A1 | 7/2010 | Bartley et al. |
| 2010/0225200 | A1 | 9/2010 | Kupnik et al. |
| 2010/0237807 | A1 | 9/2010 | Lemmerhirt |
| 2010/0246332 | A1 | 9/2010 | Huang |
| 2010/0254222 | A1 | 10/2010 | Huang |
| 2010/0256488 | A1 | 10/2010 | Kim et al. |
| 2010/0317972 | A1 | 12/2010 | Baumgartner et al. |
| 2011/0050033 | A1 | 3/2011 | Nikoozadeh et al. |
| 2011/0071397 | A1 | 3/2011 | Wodnicki et al. |
| 2011/0084570 | A1 | 4/2011 | Soeda et al. |
| 2011/0218436 | A1 | 9/2011 | Dewey et al. |
| 2011/0272693 | A1 | 11/2011 | Kobayashi et al. |
| 2012/0022379 | A1 | 1/2012 | Gubbini et al. |
| 2012/0074509 | A1 | 3/2012 | Berg et al. |
| 2012/0289829 | A1 | 11/2012 | Barnes et al. |
| 2013/0116561 | A1 | 5/2013 | Rothberg et al. |
| 2014/0066763 | A2 | 3/2014 | Rothberg et al. |
| 2014/0217478 | A1 | 8/2014 | Rothberg et al. |
| 2014/0219062 | A1 | 8/2014 | Rothberg et al. |
| 2014/0264660 | A1 | 9/2014 | Rothberg et al. |
| 2014/0288428 | A1 | 9/2014 | Rothberg et al. |
| 2014/0296713 | A1 | 10/2014 | Hyuga |
| 2015/0032002 | A1 | 1/2015 | Rothberg et al. |
| 2015/0080724 | A1 | 3/2015 | Rothberg et al. |
| 2015/0087977 | A1 | 3/2015 | Rothberg et al. |
| 2015/0301165 | A1* | 10/2015 | Rothberg ............ G01S 7/52017 367/117 |

FOREIGN PATENT DOCUMENTS

| | | |
|---|---|---|
| WO | WO 2012/017978 A2 | 2/2012 |
| WO | WO 2014/014968 A1 | 1/2014 |
| WO | WO 2014/151362 A2 | 9/2014 |

OTHER PUBLICATIONS

International Search Report and Written Opinion mailed Sep. 15, 2014 for Application No. PCT/US2014/025567.
International Preliminary Report on Patentability mailed Sep. 24, 2015 for Application No. PCT/US2014/025567.
Invitation to Pay Additional Fees mailed Nov. 26, 2014 for Application No. PCT/US2014/047553.
International Search Report and Written Opinion mailed Mar. 2, 2015 for Application No. PCT/US2014/047553.
Invitation to Pay Additional Fees mailed Jul. 9, 2015 for Application No. PCT/US2015/026304.
International Search Report and Written Opinion mailed Sep. 14, 2015 for Application No. PCT/US2015/026304.
Office Communication and Interview Summary mailed Mar. 26, 2015 for U.S. Appl. No. 14/561,328.
Office Communication mailed Mar. 16, 2015 for U.S. Appl. No. 14/561,504.
Interview Summary mailed Apr. 6, 2015 for U.S. Appl. No. 14/561,504.
[No Author Listed], Technical Publications: Vscan Version 1.x.x CE0470 User manual GM092102. Revision 05. GE Healthcare. 2011. Chapters 1-5. 81 pages.
[No Author Listed], Universal Series Bus 3.0 Specification. Revision 1.0. Hewlett-Packard Company, Intel Corporation, Microsoft Corporation, NEC Corporation, STEricsson, and Texas Instruments. Jun. 6, 2011 531 pages.
Agarwal et al., Single-Chip Solution for Ultrasound Imaging Systems: Initial Results. 2007 IEEE Ultrasonics Symposium. Oct. 1, 2007;1563-6.
Bavaro et al., Element Shape Design of 2-D CMUT Arrays for Reducing Grating Lobes. IEEE Trans Ultrason Ferroelectr Freq Contr. Feb. 2008;55(2):308-18.
Calmes et al., Highly Integrated 2-D Capacitive Micromachined Ultrasonic Transducers. 1999 IEEE Ultrason Symp. 1999;1163-6.
Chen et al., Ultrasonic Imaging Front-End Design for CMUT: A 3-Level 30Vpp Pulse-Shaping Pulser with Improved Efficiency and a Noise-Optimized Receiver. IEEE Asian Solid-State Circuits Conference. Nov. 12-14, 2012;173-6.
Cheng et al., An Efficient Electrical Addressing Method Using Through-Wafer Vias for Two-Dimensional Ultrasonic Arrays. 2000 IEEE Ultrasonics Symposium. 2000;2:1179-82.
Cheng et al., CMUT-in-CMOS ultrasonic transducer arrays with on-chip electronics. Transducers 2009. IEEE. Jun. 21, 2009;1222-5.
Cheng et al., Electrical Through-Wafer Interconnects with Sub-PicoFarad Parasitic Capacitance. 2001 Microelectromechan Syst Conf. Aug. 24, 2001;18-21.
Daft et al., 5F-3 A Matrix Transducer Design with Improved Image Quality and Acquisition Symposium. Oct. 1, 2007;411-5.
Daft et al., Microfabricated Ultrasonic Transducers Monolithically Integrated with High Voltage Electronics. 2004 IEEE Ultrasonics Symposium. Aug. 23, 2004;1:493-6.
Doody et al., Modeling and Characterization of CMOS-Fabricated Capacitive Micromachined Ultrasound Transducers. J Microelectromechan Sys. Feb. 2011;20(1):104-118.
Eccardt et al., Micromachined ultrasound transducers with improved coupling factors from a CMOS compatible process. Ultrasonics. Mar. 2000;38:774-80.
Eccardt et al., Surface micromachined ultrasound transducer in CMOS technology. Proc Ultrason Symp. 1996;959-62.
Gurun et al., Front-end CMOS electronics for monolithic integration with CMUT arrays: circuit design and initial experimental results. Proc Ultrason Symp. 2008;390-3.
Kim et al., Design and Test of a Fully Controllable 64×128 2-D CMUT Array Integrated with Reconfigurable Frontend ASICs for Volumetric Ultrasound Imaging. IEEE. International Ultrasonics Symposium Proceedings. Oct. 7-10, 2012;77-80. doi: 10.1109/ULTSYM.2012.0019.
Knight et al., Low Temperature Fabrication of Immersion Capacitive Micromachined Ultrasonic Transducers on Silicon and Dielectric Substrates. IEEE Trans Ultrason Ferroelectr Freq Contr. Oct. 2004;51(10):1324-33.
Kupnik et al., CMUT Fabrication Based on a Thick Buried Oxide Layer. Proc IEEE Ultrason Symp. Oct. 2010;2010:547-550. doi:10.1109/ULTSYM.2010.5935935. Epub Jun 8, 2012. 10 pages.
Kupnik et al., Wafer-Bonded CMUT Meets CMOS. 2010 CMOS Emerging Technology Workshop. May 21, 2010;1-22.
Lin et al., Packaging of Large and Low-Pitch Size 2D Ultrasonic Transducer Arrays. MEMS Conf. 2010;508-11.
Nikoozadeh et al., Forward-Looking Intracardiac Ultrasound Imaging Using a 1-D CMUT Array Integrated With Custom Front-End Electronics. IEEE Trans Ultrason Ferroelectr Freq Contr. Dec. 2008;55(12):2651-60.

(56) References Cited

OTHER PUBLICATIONS

Noble et al., A cost-effective and manufacturable route to the fabrication of high-density 2D micromachined ultrasonic transducer arrays and (CMOS) signal conditioning electronics on the same silicon substrate. Proc Ultrason Symp. 2001;941-5.

Noble et al., Low-temperature micromachined CMUTs with fully-integrated analogue front-end electronics. Proc Ultrason Symp. 2002;1045-50.

Oralkan et al., Volumetric Imaging Using 2D Capacitive Micromachined Ultrasonic Transducer Arrays (CMUTs): Initial Results. 2002 IEEE Ultrason Symp. 2002;1083-6.

Oralkan et al., Volumetric Ultrasound Imaging Using 2-D CMUT Arrays. IEEE Trans Ultrason Ferroelectr Freq Contr. Nov. 2003;50(11):1581-94.

Park et al., Fabrication of Capacitive Micromachined Ultrasonic Transducers via Local Oxidation and Direct Wafer Bonding. J Microelectromechan Syst. Feb. 2011;20(1):95-103.

Tsuji et al., Low Temperature Process for CMUT Fabrication with Wafer Bonding Technique. IEEE Intl Ultrason Symp Proc. 2010;551-4.

Um et al., An Analog-Digital-Hybrid Single-Chip RX Beamformer with Non-Uniform Sampling for 2D-CMUT Ultrasound Imaging to Achieve Wide Dynamic Range of Delay and Small Chip Area. IEEE International Solid-State Circuits Conference. Feb. 12, 2014;426-8.

Wodnicki et al., Multi-Row Linear CMUT Array Using CMUTs and Multiplexing Electronics. Proc Ultrason Symp. 2009;2696-9.

Wolffenbuttel et al., Low-temperature silicon wafer-to-wafer bonding using gold at eutectic temperature. Sensors and Actuators A. 1994;43:223-9.

Wygant et al., Integration of 2D CMUT Arrays with Front-End Electronics for Volumetric Ultrasound Imaging. IEEE Trans Ultrason Ferroelectr Freq Contr. Feb. 2008;55(2):327-42.

Zahorian et al., Single chip CMUT arrays with integrated CMOS electronics: fabrication process development and experimental results. Proc Ultrason Symp. 2008;386-9.

Zhuang et al., Wafer-bonded 2-D CMUT arrays incorporating through-wafer trench-isolated interconnects with a supporting frame. IEEE Trans Ultrason Ferroelectr Freq Control. Jan. 2009;56(1):182-92. doi: 10.1109/TUFFC.2009.1018.

PCT/US2014/025567, Jul. 2, 2014, Invitation to Pay Additional Fees.

PCT/US2014/025567, Sep. 15, 2014, International Search Report and Written Opinion.

PCT/US2014/025567, Sep. 24, 2015, International Preliminary Report on Patentability.

PCT/US2014/047553, Nov. 26, 2014, Invitation to Pay Additional Fees.

PCT/US2014/047553, Mar. 2, 2015, International Search Report and Written Opinion.

PCT/US2015/026304, Jul. 9, 2015, Invitation to Pay Additional Fees.

PCT/US2015/026304, Sep. 14, 2015, International Search Report and Written Opinion.

\* cited by examiner

ARCHITECTURE OF SINGLE SUBSTRATE ULTRASONIC IMAGING DEVICES, RELATED APPARATUSES, AND METHODS

CROSS-REFERENCE TO RELATED APPLICATIONS

The present application claims the benefit under 35 U.S.C. §120 and is a continuation of U.S. patent application Ser. No. 14/689,090 entitled "ARCHITECTURE OF SINGLE SUBSTRATE ULTRASONIC IMAGING DEVICES, RELATED APPARATUSES, AND METHODS," filed Apr. 17, 2015, which claims the benefit under 35 U.S.C. §119(e) of U.S. Provisional Patent Application Ser. No. 61/981,469 entitled "ARCHITECTURE OF SINGLE SUBSTRATE ULTRASONIC IMAGING DEVICES, RELATED APPARATUSES, AND METHODS," filed Apr. 18, 2014. Each of the above-listed applications is incorporated herein by reference in its entirety.

FIELD

Aspects of the technology described herein relate to the architecture of single substrate ultrasonic imaging devices, related apparatuses, and methods.

BACKGROUND

Conventional ultrasonic scanners dominating the ultrasound imaging industry have discrete transducers and control electronics. The transducers are often piezoelectric. As a result, the scanners are made using "dice and fill" manufacturing processes in which individual piezoelectric elements are cut and then positioned individually on a substrate to form a transducer probe. Such processes are prone to the cost, non-uniformity, and non-scalability of machining and wiring. Control electronics are typically not integrated with the transducers, but rather formed and housed separately.

Ultrasound transducer probes used for medical applications typically comprise many ultrasound elements each configured to emit ultrasound signals that collectively produce a medically relevant ultrasound field used to produce ultrasound images for medical applications. Typically, each ultrasound transducer is configured to emit an ultrasound waveform generated by a corresponding waveform generator. Thus, many waveform generators are needed to produce an ultrasound field with a conventional ultrasound transducer probe having many ultrasound elements.

BRIEF SUMMARY

Aspects of the technology describe herein include an architecture and techniques which may facilitate integration of a substantial portion of, or even an entire, ultrasonic imaging system on a single semiconductor substrate. Accordingly, many of the features and methodologies described herein relate to a single-chip ultrasonic imaging solution, or to devices and systems wherein at least a substantial portion of the ultrasonic imaging system is provided on a single chip.

According to an aspect of the technology, the single substrate ultrasound imaging system comprises waveform generators, delay mesh circuitry, and ultrasound transducers all integrated with the substrate. The delay mesh circuitry may be configured to provide waveforms generated by the waveform generators to the ultrasound transducers and may allow for the system to have fewer waveform generators than ultrasound transducers, which may facilitate the provision of the imaging system on a single chip. To this end, the delay mesh circuitry may receive an input signal corresponding to a waveform generated by a waveform generator, produce a plurality of time-delayed versions of the input signal, and provide the resulting signals to multiple ultrasonic transducers.

Some embodiments are directed to an apparatus, comprising: a substrate; a first ultrasound transmission unit integrated with the substrate; and delay mesh circuitry integrated with the substrate, coupled to an input of the first ultrasound transmission unit and configured to output to the first ultrasound transmission unit a time-delayed version of a delay mesh circuitry input signal corresponding to a waveform generated by a waveform generator.

Some embodiments are directed to an apparatus, comprising: a substrate; a plurality of ultrasound transmission units integrated with the substrate; and delay mesh circuitry integrated with the substrate, coupled to inputs of the plurality of ultrasound transmission units and configured to output to the plurality of ultrasound transmission units a plurality of time-delayed versions of a delay mesh circuitry input signal corresponding to a waveform generated by a waveform generator.

Some embodiments are directed to an apparatus, comprising: a substrate; a plurality of ultrasound transmission units integrated with the substrate; and delay mesh circuitry integrated with the substrate, coupled to inputs of the plurality of ultrasound transmission units, and configured to: in response to input of a first delay mesh control signal, output to the plurality of ultrasound transmission units a first plurality of time-delayed versions of a delay mesh circuitry input signal corresponding to a waveform generated by a waveform generator; and in response to input of a second delay mesh control signal different from the first delay mesh control signal, output to the plurality of ultrasound transmission units a second plurality of time-delayed versions of the delay mesh circuitry input signal corresponding to the waveform generated by the waveform generator, wherein the first plurality of time-delayed version of the delay mesh circuitry input signal is different from the second plurality of time delayed versions of the delay mesh circuitry input signal.

Some embodiments are directed to an apparatus, comprising: a substrate; a plurality of waveform generators integrated with the substrate; a plurality of ultrasound transmission units integrated with the substrate; and delay mesh circuitry integrated with the substrate, coupled to inputs of the plurality of ultrasound transmission units and configured to output to the plurality of ultrasound transmission units a plurality of time-delayed versions of delay mesh circuitry input signals corresponding to a plurality of waveforms generated by the plurality of waveform generators.

Some embodiments are directed to an apparatus, comprising: a complementary metal oxide semiconductor (CMOS) substrate; at least one waveform generator integrated with the CMOS substrate and configured to generate at least one initial waveform; encoding circuitry integrated with the CMOS substrate, coupled to at least one output of the at least one waveform generator, and configured to encode the at least one initial waveform to produce at least one encoded waveform; delay mesh circuitry integrated with the CMOS substrate, coupled to at least one output of the encoding circuitry, and configured to generate a plurality of time-delayed versions of the at least one encoded waveform; and a plurality of ultrasound transmission units integrated with the CMOS substrate, coupled to a plurality of outputs of the delay mesh circuitry, the plurality of ultrasound transmission units comprising: decoding circuitry configured to decode the plurality of time-delayed versions of the at least one encoded waveform to produce a plurality of decoded waveforms; and a plurality of ultrasonic transducers configured to generate an ultrasound field at least in part by concurrently transmitting ultrasound signals corresponding to the plurality of decoded waveforms.

Some embodiments are directed to a method comprising using a single substrate ultrasound device to perform: encoding a waveform generated by a waveform generator to obtain an encoded waveform; producing a plurality of time-delayed versions of the encoded waveform; decoding the plurality of time-delayed versions of the encoded waveform to obtain a plurality of decoded waveforms; and generating an ultrasound field at least in part by transmitting in parallel, using a plurality of ultrasound elements, ultrasound signals corresponding to the plurality of decoded waveforms.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
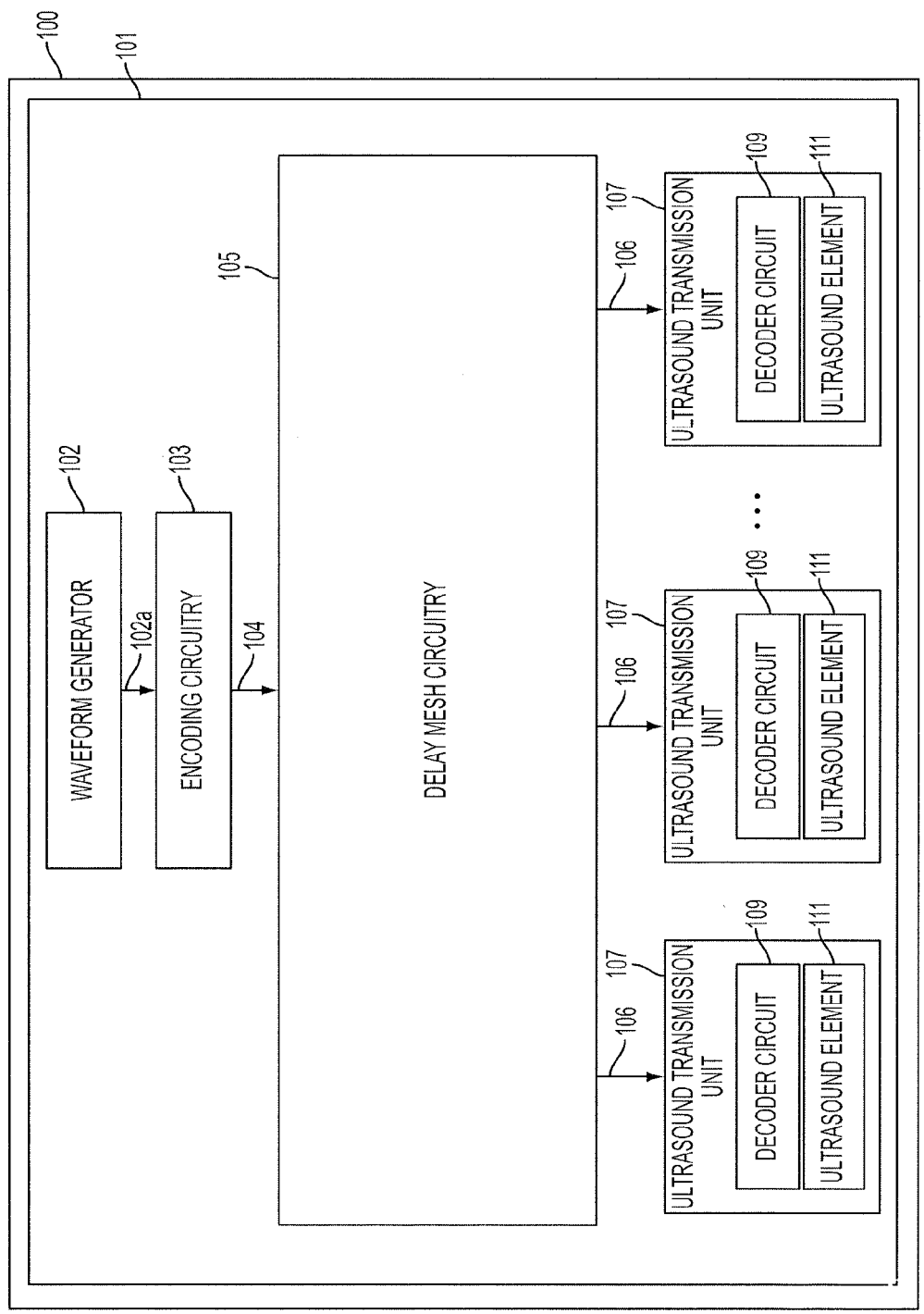
FIG. 1 shows an illustrative single substrate ultrasound device embodying various aspects of the technology described herein.

Aspects of the technology described herein relate to an ultrasound device circuitry architecture, as may form part of a single substrate ultrasound device having integrated ultrasonic transducers, for example complementary metal oxide semiconductor (CMOS) ultrasonic transducers. Thus, the circuitry architecture may in some embodiments form part of an ultrasound system-on-a-chip (SoC) having integrated circuitry and ultrasonic transducers integrated with (e.g., formed in, or monolithically integrated with) a substrate, such as a semiconductor substrate.

As described further below, aspects of the present technology provide delay and encoding/decoding circuitry configurations facilitating the generation of medically relevant ultrasound waveforms using an integrated ultrasonic transducer arrangement in a manner that is power- and data-efficient.

Applicants have appreciated that implementing an ultrasound device having integrated ultrasonic transducers and integrated circuitry on a single substrate, such as a CMOS substrate, remains difficult due to the complexity of such devices. Creating complex and medically relevant ultrasound waveforms for use in ultrasound imaging generally requires large amounts of data, and therefore large available memory storage for storing waveform parameters. At the same time, there are practical limits to the configuration and operation of a single substrate ultrasound device, for example in terms of the amount of memory, data, and power which can be used.

One such practical limitation is the number of waveform generators used to generate the waveforms to be emitted by an arrangement (e.g., an array) of ultrasonic transducers integrated with the substrate. While providing one waveform generator for each ultrasonic transducer may be beneficial in some contexts, doing so is impractical in the scenario in which the waveform generators are to be integrated on the substrate with the ultrasonic transducers due to the space and power requirements. Thus, Applicants have appreciated that in some scenarios it is preferable to provide a single substrate ultrasound device having integrated thereon fewer waveform generators than ultrasonic transducers to which the desired waveform is to be provided.

According to an aspect of the technology, the circuitry architecture of an ultrasound device may include circuitry configured to produce, from a single waveform provided by a waveform generator, a plurality of versions of the waveform that can be provided to a plurality of ultrasonic transducers of an ultrasonic transducer arrangement to produce a desired ultrasound field. The plurality of versions of the waveform may include time-delayed and/or inverted versions of the waveform. The plurality of versions of the waveform may be provided in parallel in at least some embodiments so that desired (e.g., medically relevant) ultrasound fields may be emitted from the plurality of ultrasonic transducers (e.g., plane wave fields, cylindrically focused fields, focused beams, virtual source fields, etc.).

According to an aspect of the technology, the circuitry may include a delay mesh for accomplishing the task of producing the multiple versions of the waveform, the delay mesh having an input configured to receive the waveform generated by the waveform generator and a plurality of (parallel) outputs configured to provide the multiple versions of the waveform to the plurality of ultrasonic transducers.

The delay mesh may be may be controlled to produce different versions of the waveform generated by the waveform generator in response to different controls applied to the delay mesh. In this way, the ultrasound device can be controlled to generate different types of ultrasound fields, examples of which are described below.

According to an aspect of the technology, the circuitry of the ultrasound device includes encoding and decoding circuitry configured to encode and decode waveforms to be provided to a plurality of ultrasonic transducers of an ultrasonic transducer arrangement. The encoding and decoding circuitry may reduce the amount of data required to provide waveforms generated by one or more waveform generators to the ultrasonic transducer(s) configured to transmit ultrasound signals corresponding to the waveforms, and thus may provide a valuable reduction in the amount of memory required to store and communicate the desired waveform data among components of the single substrate ultrasound device. In some embodiments, the encoding and decoding circuitry may be arranged between a waveform generator and the ultrasonic transducer(s) to which the waveform is to be provided. In some embodiments, delay mesh circuitry may be arranged between encoding circuitry and the decoding circuitry, which may provide a valuable reduction in the amount of memory required to store and communicate the waveform data among components of the delay mesh circuitry.

In some embodiments, delay mesh circuitry may comprise a plurality of delay mesh units each of which may delay an input signal to obtain one or more time-delayed versions of the input signal and provide them as output signals to one or more ultrasound transmission units to be transmitted and/or to one or more other delay mesh units for further processing. Output signals provided to one or more other delay mesh units may be further time-delayed by those delay mesh units and be transmitted and/or further processed by still other delay mesh units. In this way, a signal input to the delay mesh circuitry may propagate through a plurality of delay mesh units, with one or more of the delay mesh units time-delaying the signal providing the resulting time-delayed version(s) to one or more ultrasound elements for transmission. As such, delay mesh circuitry may generate multiple time-delayed versions of the input signal and provide these versions for transmission to ultrasound transducers integrated with the single substrate ultrasound device for generation of an ultrasound field.

A delay mesh unit may comprise a buffer for storing and/or performing operations on a signal input to the buffer. In some embodiments, delay mesh circuitry may comprise many delay mesh units and, as such, reducing the size of the buffer of each delay mesh unit may reduce both space and power requirements of implementing delay mesh circuitry on a single substrate ultrasound device.

As may be appreciated from the above, aspects of the present technology provide space- and power-efficient circuitry configurations for providing desired waveforms to an ultrasonic transducer arrangement to allow for production of medically relevant ultrasonic fields. The circuitry may be fully digitized in some embodiments, and may be integrated with the ultrasonic transducers on a single substrate, such as a CMOS substrate.

The aspects and embodiments described above, as well as additional aspects and embodiments, are described further below. These aspects and/or embodiments may be used individually, all together, or in any combination of two or more, as the technology described herein is not limited in this respect.

FIG. 1 shows an illustrative single substrate ultrasound device 100 embodying various aspects of the technology described herein. Ultrasound device 100 comprises a substrate 101, such as a CMOS substrate or chip (e.g., a semiconductor substrate such as a silicon substrate), and integrated circuitry formed thereon. As shown, circuitry integrated with the substrate 101 may comprise waveform generator 102, encoding circuitry 103, delay mesh circuitry 105, and a plurality of ultrasound transmission units 107. An ultrasound transmission unit 107 may comprise a decoding circuit 109 and one or more ultrasound elements 111. As such, ultrasound device 100 may comprise a plurality of decoding circuits (herein also referred to as "decoding circuitry") and a plurality of ultrasound elements. Ultrasound element 111 may include one or more ultrasonic transducers (also referred to herein as "transducer cells"). Stated differently, ultrasonic transducers may be grouped together to form ultrasound elements, as described in more detail below with reference to FIG. 3. It should be appreciated that although in some embodiments the above-described components may be integrated on a single substrate, aspects of the present technology are not limited in this respect and, in other embodiments, at least some of the above-described components may not be integrated on a same substrate with one another.

The illustrative configuration shown in FIG. 1 may facilitate formation of an ultrasound system-on-a-chip device or an ultrasound sub-system-on-a-chip device including integrated ultrasonic transducers and circuitry (e.g., analog and/or digital circuitry such as front-end and/or back-end circuitry for controlling operation of the ultrasonic transducers and/or processing signals produced by such transducers, for example to form and/or display ultrasound images). In at least some embodiments, an ultrasound system-on-a-chip device may include, on a single substrate, an arrangement of ultrasonic transducers integrated with analog and digital circuitry, and may be capable of performing ultrasound imaging functions such as emitting and receiving ultrasound waves and processing received ultrasound waves to produce ultrasound images.

As illustrated in FIG. 1, the circuitry arranged between waveform generator 102 and ultrasound elements 111 functions to provide waveforms generated by waveform generator 102 to ultrasound elements 111 in a space- and power-efficient manner and may be referred to as "compact-mesh architecture." In the illustrated embodiment, the compact-mesh architecture includes encoding circuitry 103, delay mesh circuitry 105, and decoding circuitry 109. Though, in other embodiments, the compact mesh architecture may comprise delay mesh circuitry but not include encoding or decoding circuitry.

In some embodiments, waveform generator 102 may generate an initial waveform and output the initial waveform to an input of encoding circuitry 103. Encoding circuitry 103 may be configured to encode the initial waveform to produce an encoded waveform and output the encoded waveform to an input of the delay mesh circuitry 105. Delay mesh circuitry 105 may be configured to generate a plurality of time-delayed versions of the encoded waveform and output, in parallel, the plurality of time-delayed versions of the encoded waveform to inputs of ultrasound transmission units 107. That is, the delay mesh circuitry may produce a greater number of output versions than it receives input versions. The ultrasound transmission units 107 may be configured to decode the respective ones of plurality of time-delayed versions of the encoded waveform using decoding circuitry 109 to produce a plurality of decoded waveforms and drive the ultrasound elements 111, based on the plurality of decoded waveforms, such that the ultrasound elements 111 transmit ultrasound signals corresponding to (e.g., based on) the decoded waveforms. In this way, ultrasound elements 111 may operate in parallel to emit a desired ultrasound wave, examples of which will be provided below. The above-mentioned components and corresponding functionality are described in more detail below.

In the embodiment shown, all of the illustrated elements are formed on a single substrate 101. It should be appreciated, however, that in alternative embodiments one or more of the illustrated elements may be coupled to substrate 101 but not be integrated with it. For example, in some embodiments waveform generator 102 may be instead located off of the substrate 101, but be coupled to the substrate 101 so that waveform generator 102 may communicate with (e.g., provide input signals to) encoding circuitry 103. As another example, the compact mesh architecture (e.g., the delay mesh circuitry 105 and, optionally, encoding circuitry 103 and decoding circuitry 109) may be integrated with the substrate 101, but the waveform generator 102 and/or ultrasound elements 111 may be coupled to but not integrated with substrate 101.

As described, in some embodiments ultrasound device 100 may comprise a single substrate, ultrasonic transducers integrated with that substrate, and circuitry (e.g., controlling circuitry) integrated with that substrate. It should be appreciated that the ultrasonic transducers may be positioned in any suitable way with respect to any other circuitry integrated with the substrate (e.g., waveform generator 102, encoding circuitry 103, delay mesh 105, decoding circuitry 109, etc.). In some embodiments, at least some circuitry integrated with the substrate of the ultrasound device may be positioned beneath the ultrasonic transducers of the device. In some embodiments, some of the integrated circuitry may be positioned on a peripheral region (or "tab") of the ultrasound device. For example, circuitry which is shared among two or more of the ultrasonic transducers or ultrasound elements may be positioned on the peripheral region. Circuitry specific to an ultrasound element or to a particular ultrasonic transducer may be positioned beneath that ultrasound element or ultrasonic transducer in some embodiments.

Waveform generator 102 may be configured to generate (or produce) any suitable excitation waveform(s) to excite the ultrasonic transducers. The waveform generator may be configured to (e.g., programmable to) generate a desired kind of waveform from among multiple possible kinds, including impulses, continuous waves, chirp waveforms (e.g., linear frequency modulation (LFM)) chirps), and coded excitations (e.g., binary coded excitations). Such flexibility in the waveform generated may also facilitate the use of highly advanced ultrasound imaging techniques. In some embodiments, the waveform generator may generate a waveform as a sequence of values each of which is selected from a set of possible values. The set of possible values may consist of two values, three values, five values, at least five values, three-ten values or any other suitable number of values. For example, the set of possible values may consist of any values that may be generated by a n-bit digital to analog converter (i.e., $2^n$ bits), where n is any positive integer (e.g., 2, 4, 8, 16, 32, 64, etc.). In some embodiments, the waveform generator may be configured to generate outputs for a bipolar pulser.

As shown, waveform generator 102 is coupled to an input of encoding circuitry 103. In this way, waveform generator may provide any signal or signals 102a it generates to encoding circuitry 103. The waveform generator 102 may be coupled to an input of encoding circuitry 103 in any suitable way, as aspects of the technology described herein are not limited in this respect.

Encoding circuitry 103 may be configured to encode an initial waveform generated by the waveform generator 102 to produce an encoded waveform 104 and to provide the encoded waveform as an input signal to the delay mesh circuitry 105. To this end, an input of encoding circuitry 103 may be coupled to an output of waveform generator 102 and an output of encoding circuitry 103 may be coupled to an input of delay mesh circuitry 105. The coupling of the encoding circuitry 103 to waveform generator 102 and to delay mesh circuitry 105 may be implemented in any suitable way, as aspects of the technology described are not limited in this respect.

Encoding circuitry 103 may be configured to implement a compressive encoding so that when the encoding circuitry 103 encodes an input signal, the resultant encoded signal consists of fewer bits than the input signal that was encoded. This reduction of data makes integration of the system described herein on a single substrate more feasible. For example, as described in more detail below, compressive encoding of the input signal allows for the delay mesh units in the delay mesh circuitry to be implemented using a smaller amount of memory, which results in space and power savings. In some embodiments, encoding circuitry 103 may be configured to implement an N-to-M bit encoder (where each of N and M is a positive integer and where N is greater than M) so that when the encoding circuitry 103 encodes an input signal consisting of B bits the resultant encoded signal consists of approximately B*M/N bits (where B is a positive integer). As a specific non-limiting example, encoding circuitry 103 may be configured to implement a 2-to-1 bit encoder so that when the encoding circuitry encodes an input signal consisting of B bits, the resultant encoded signal consists of approximately B/2 bits. As another specific non-limiting example, encoding circuitry 103 may be configured to implement a 3-to-2 bit encoder so that when the encoding circuitry encodes an input signal consisting of B bits, the resultant encoded signal consists of approximately 2B/3 bits. As yet another specific non-limiting example, the encoding circuitry 103 may be configured to implement a 3-to-1 bit encoder so that when the encoding circuitry encodes an input signal consisting of B bits, the resultant signal consists of approximately B/3 bits. Encoding circuitry 103 is described in more detail with reference to FIGS. 7, 8A, and 8C below.

Delay mesh circuitry 105 may be configured to generate a plurality of time-delayed versions of a delay mesh circuitry input signal 104 corresponding to a waveform generated by a waveform generator and provide the generated time-delayed versions of the waveform to the ultrasound transmission units 107. In the embodiment of FIG. 1, the delay mesh circuitry input signal may be an encoded waveform obtained by using encoding circuitry 103 to encode a waveform generated by waveform generator 102. In other embodiments (e.g., where the encoding circuitry 103 is either not used or is not part of ultrasound device 100), the delay mesh circuitry input signal may be a waveform 102a generated by waveform generator 102. In such embodiments, the delay mesh would be able to accommodate (e.g., with appropriately sized buffers) to accommodate the unencoded input signals.

As shown, an input of delay mesh circuitry 105 may be coupled to an output of encoding circuitry 103 and an output of delay mesh circuitry 105 may be coupled to inputs of ultrasound transmission units 107. Alternatively, an input of delay mesh circuitry 105 may be coupled to an output of waveform generator 102. The coupling of the delay mesh circuitry 105 to encoding circuitry 103 (and/or waveform generator 102) and to ultrasound transmission units 107 may be implemented in any suitable way, as aspects of the technology described herein are not limited in this respect.

Delay mesh circuitry 105 may be configured to generate a plurality of time-delayed versions of a delay mesh circuitry input signal at least in part by propagating the input signal through a network of interconnected delay mesh units that are part of the delay mesh circuitry. Each delay mesh unit may be configured to receive an input signal, delay it by a specified amount, and output one or more delayed versions of the input signal to one or more other delay mesh units and/or ultrasound transmission units. In this way, the delay mesh units operate to generate a set of time-delayed versions of the delay mesh input signal and provide these signals to the plurality of ultrasound transmission units 107, which operate to transmit concurrently at least some of the time-delayed versions of the delay mesh input signal to emit a desired ultrasound field. As may be appreciated, each delay mesh unit may be configured to provide one or more time-delayed versions of the signal received by the delay mesh unit to multiple other destinations (e.g., a delay mesh unit may provide a version of the signal delayed by one amount to another delay mesh unit and a version of the signal delayed by another different amount to an ultrasound transmission unit). This flexibility allows the delay mesh to create multiple instances or versions of the delay mesh input signal.

In some embodiments, delay mesh circuitry 105 may be controlled to produce a desired set of time-delayed versions 106 of the delay mesh input signal. In some embodiments, delay mesh circuitry 105 may be programmable so that one or more delay mesh units in the delay mesh circuitry 105 may be programmed to delay the signal(s) input to the controllable delay mesh unit(s) by an amount (e.g., amount of time, number of bits, etc.) indicated by control signal(s) provided to the delay mesh unit(s). Additionally or alternatively, the delay mesh circuitry 105 may be reconfigurable so that one or more control signals may be used to specify which delay mesh unit(s) may communicate (e.g., receive input from and/or provide output to) with one another. For example, a delay mesh unit in the delay mesh circuitry 105 may be controlled to receive an input signal from a source (e.g., another delay mesh unit, a waveform generator, etc.) indicated by control signal(s) provided to the delay mesh unit. As another example, a delay mesh unit in the delay mesh circuitry 105 may be controlled to provide a delayed version 106 of the input signal to those delay mesh units and/or ultrasound transmission units that are indicated by control signal(s) provided to the delay mesh unit. Accordingly, the manner in which the delay mesh input signal is propagated through the delay mesh circuitry 105 may be controlled by providing control signals to one more delay mesh units in the delay mesh circuitry 105 in order to obtain a desired set of time-delayed versions of the delay mesh circuitry input signal. Aspects of delay mesh circuitry 105 are further described below with reference to FIGS. 4, 5A-5B, and 6.

Ultrasound transmission units 107 may be configured to receive the time-delayed versions of the delay mesh circuitry signal from delay mesh circuitry 105, decode the time-delayed versions of the delay mesh circuitry signal to obtain a plurality of decoded waveforms, and transmit ultrasound signals corresponding to at least a subset of the plurality of decoded waveforms. As shown, inputs of ultrasound transmission units 107 may be coupled to outputs of delay mesh circuitry 105. The coupling between the ultrasound transmission units 107 and delay mesh circuitry 105 may be implemented in any suitable way, as aspects of the technology described herein are not limited in this respect. Ultrasound device 100 may comprise any suitable number of ultrasound transmission elements. This is described in further detail below with reference to FIG. 3.

As shown, an ultrasound transmission unit comprises a decoding circuit 109 and one or more ultrasound elements 111. However, in some embodiments, an ultrasound transmission unit may comprise additional circuitry including, but not limited to, one or more amplifiers (e.g., one or more transimpedance amplifiers), one or more pulsers (e.g., one or more tri-level pulsers, one or more bipolar pulsers configured to drive positive and negative voltages, one or more unipolar pulsers, etc.), and/or any other suitable circuitry, as aspects of the technology described herein are not limited by the types of circuitry which are part of ultrasound elements 111.

Ultrasound transmission units 107 may be configured to decode the time-delayed versions 106 of the delay mesh circuitry input signal 104 by using decoding circuitry 109. Decoding circuitry 109 may be configured to implement a decoding corresponding to the encoding implemented by encoding circuitry 103. For example, in embodiments where encoding circuitry 103 is configured to encode an initial signal so that the resultant encoded signal has fewer bits than the initial signal, decoding circuitry 109 may be configured to decode the encoded signal so that the decoded signal has a greater number of bits than the encoded signal (e.g., the decoded signal may have the same number of bits as the initial signal encoded by the encoding circuitry).

In some embodiments, decoding circuitry 109 may be configured to implement an M-to-N bit decoder (where each of N and M is a positive integer and where N is greater than M) so that when the decoding circuitry 109 decodes an encoded signal consisting of B bits, the resultant decoded signal consists of approximately $B*N/M$ bits. As a specific non-limiting example, decoding circuitry 109 may be configured to implement a 1-to-2 bit decoder so that when the decoding circuitry decodes an encoded signal consisting of B bits, the resultant decoded signal consists of approximately 2B bits. As another specific non-limiting example, decoding circuitry 109 may be configured to implement a 2-to-3 bit decoder so that when the decoding circuitry decodes an encoded signal consisting of B bits, the resultant decoded signal consists of approximately $3B/2$ bits. Such a decoder may be useful for a 5-8 level pulser. As yet another specific non-limiting example, decoding circuitry 109 may be configured to implement a 1-to-3 bit decoder so that when the decoding circuitry decodes an encoded signal consisting of B bits, the resultant decoding signal consists of approximately 3B bits. Decoding circuitry 109 is described in more detail with reference to FIGS. 7, 8B, and 8D below.

Ultrasound transmission units 107 may be configured to transmit ultrasound signals corresponding to the plurality of decoded waveforms by using ultrasound elements 111. This may be done in any suitable way. For example, the ultrasound elements may be driven according to the plurality of decoded waveforms to generate ultrasound signals corresponding to the plurality of decoded waveforms. As previously described, an ultrasound element 111 may comprise one or multiple ultrasonic transducers. The ultrasonic transducers may be of any suitable type, and in some embodiments the ultrasonic transducers may be compatible with a CMOS substrate, thus allowing them to be monolithically formed on a CMOS substrate with CMOS integrated circuits. In this manner, an integrated device (e.g., an ultrasound system-on-a-chip) may be formed.

In some embodiments, the ultrasonic transducers may be CMOS ultrasonic transducers (CUTs), which include an ultrasonic transducer formed on a CMOS wafer and monolithically integrated with CMOS integrated circuitry. A CUT may, for example, include a cavity formed in a CMOS wafer, with a membrane (or diaphragm) overlying the cavity, and in some embodiments sealing the cavity. Electrodes may be provided to create a transducer cell from the covered cavity structure. The CMOS wafer may include integrated circuitry to which the transducer cell may be connected.

CUTs are not the only type of ultrasonic transducer which may allow for integration of the transducer with an IC. In some embodiments, the ultrasonic transducers may be capacitive micromachined ultrasonic transducers (CMUTs).

Not all embodiments are limited to employing CUTs or CMUTs in an ultrasound transducer device of the types described herein. Some aspects of the technology described herein apply to ultrasound transducer devices irrespective of the type of ultrasonic transducer implemented. For example, in some embodiments, an array of speakers, microphones, or any suitable ultrasound transducer array may be used.

In some embodiments, each of the plurality of time-delayed versions of the delay mesh circuitry input signal (generated by delay mesh circuitry 105) may be output to a respective ultrasound transmission unit 107 (each comprising a decoding circuit 109 and ultrasound element 111, as shown in FIG. 1). The decoding circuit 109 of a particular ultrasound transmission unit 107 may be configured to decode the time-delayed version of the delay mesh circuitry input signal provided to the particular ultrasound transmission unit. Accordingly, the decoding circuits 109 in the ultrasound transmission units 107 may be configured to produce a plurality of decoded waveforms. In turn, the ultrasound elements 111 in the ultrasound transmission units 107 are configured to transmit ultrasound signals corresponding to the plurality of decoded waveforms.

In some embodiments, the ultrasound elements 111 in the ultrasound transmission units 107 are configured to transmit ultrasound signals corresponding to the plurality of decoded waveforms temporally in parallel so that the parallel transmission of the decoded waveforms results in the emission, by the single substrate ultrasound device 100, of a desired ultrasound field. For example, the emitted ultrasound field may be formed as a superposition of signals (e.g., ultrasound signals corresponding to the decoded waveforms) transmitted in parallel by the ultrasound elements 111.

In some embodiments, parallel transmission of two signals may be concurrent, substantially concurrent, or substantially simultaneous. The transmission of two signals is concurrent if the signals have any overlap in time as they are being transmitted. The transmission of signals is substantially concurrent if overlapping in time by at least 80%, by at least 90%, or more. The transmission of two signals is simultaneous if overlapping in time by approximately 95% or more.

As may be appreciated from the above, the type of ultrasound field produced by parallel operation of ultrasound elements 111 depends, at least in part, on the manner in which delay mesh circuitry 105 is controlled to produce a set of time-delayed versions of a waveform, after it is encoded, and generated by waveform generator 102. The delay mesh circuitry 105 may be controlled so that the parallel operation of ultrasound elements may be configured to generate any of numerous types of ultrasound fields including, but not limited to, plane wave fields, fields having azimuthal symmetry, fields having elevation symmetry, fields having both azimuthal and elevation symmetry, cylindrical fields, cylindrical fields having azimuthal symmetry, cylindrical fields having elevation symmetry, spherically or cylindrically focused beam fields, spherically or cylindrically diverging wave fields, 3D plane wave fields, any suitable medically-relevant ultrasound field, and/or any other suitable type of ultrasound field or set of fields. As one non-limiting example, applying an inversion to waveforms according to a Hadamard code may create a suitable set of fields.

It should also be appreciated that controlling the manner in which the delay mesh circuitry 105 generates a set of time-delayed versions of each of a sequence of fields generated by a waveform generator may be used to implement scanning of a target and/or steering of the fields emitted by the ultrasound device. Such functionality, in turn, may be used to implement 3D imaging functionality.

It should also be appreciated that the architecture of a single substrate ultrasound device shown in FIG. 1 is illustrative and that variations of this architecture are possible. For example, although in the embodiment of FIG. 1 a single waveform generator 102 is coupled to encoding circuitry 103, in other embodiments ultrasound device 100 may comprise multiple waveform generators coupled to encoding circuitry 103. In such embodiments, encoding circuitry 103 may comprise multiple encoding circuits each coupled to a respective waveform generator or multiple waveform generators may be coupled to a single encoding circuit. Each waveform generator may be configured to generate one or more waveforms. The waveform generators may be operated one at a time or two or more waveform generators may be operated in parallel.

Accordingly, in some embodiments, a single substrate ultrasound device may comprise any suitable number of waveform generators. In some embodiments, the single substrate ultrasound device may consist of fewer waveform generators than ultrasound transmission units. As discussed above, having fewer waveform generators than ultrasound transmission units, each of which including one or more ultrasonic transducers, may serve to reduce space and power required for integrating the waveform generators on a single substrate with the ultrasound transmission units (in contrast with a scenario where the number of waveform generators is equal to the number of ultrasound transmission units). As one non-limiting example, a single substrate ultrasound device may include at least twice as many ultrasound transmission units as waveform generators. As another non-limiting example, a single substrate ultrasound device may include at least four times as many ultrasound transmission units as waveform generators. As yet another non-limiting example, a single substrate ultrasound device may include eight (or sixteen, or thirty-two, or sixty-four, at least 100, at least 250, at least 500, at least 1000, at least 5000, at least 10,000, between 500 and 15,000, etc.) times as many ultrasound transmission units as waveform generators.

As another example of a variation of the architecture shown in FIG. 1, which shows encoding and decoding circuitry, in some embodiments a single substrate ultrasound device may be implemented without encoding and decoding circuitry. In such an embodiment, the waveform generator(s) integrated with the substrate may be coupled, directly or indirectly, to an input of the delay mesh circuitry integrated with the substrate, which in turn may be coupled to inputs of ultrasound transmission units integrated with the substrate.

It should also be appreciated that the components shown in FIG. 1 may be only a portion of the single substrate ultrasound device 100. For example, the components shown in FIG. 1 may be a single ultrasound circuitry module of components of ultrasound device 100, whereas ultrasound device 100 may comprise multiple such modules (e.g., at least two modules, at least ten modules, at least 100 modules, at least 1000 modules, at least 5000 modules, at least 10,000 modules, at least 25,000 modules, at least 50,000 modules, at least 100,000 modules, at least 250,000 modules, at least 500,000 modules, between two and one million modules, etc.) each module comprising the components illustrated in FIG. 1. The multiple ultrasound circuitry modules may be configured to operate independently of one another and/or collaboratively with one another. This is described in more detail with reference to FIG. 3 below.

In some embodiments, operation of components shown in FIG. 1 may be controlled by components located off single substrate ultrasound device 100. For example, in some embodiments, another computing device (e.g., an FPGA, at least one computer hardware processor programmable using instructions stored on at least one non-transitory computer readable medium, etc.) may be configured to control operation of one or more components of single substrate device 100. As one non-limiting example, a computing device may provide one or more control signals to control operation of waveform generator 102, encoding circuitry 103, delay mesh circuitry 105, and/or one or more ultrasound transmission units 107. Additionally or alternatively, single substrate ultrasound device 100 may comprise one or more control components configured to control (e.g., via one or more control signals) operation of other components of single substrate ultrasound device 100. In some embodiments, one or more components of single substrate ultrasound device may be controlled by a combination of one or more "on-chip" components in device 100 and "off-chip" components arranged off of device 100.

Figure 2:
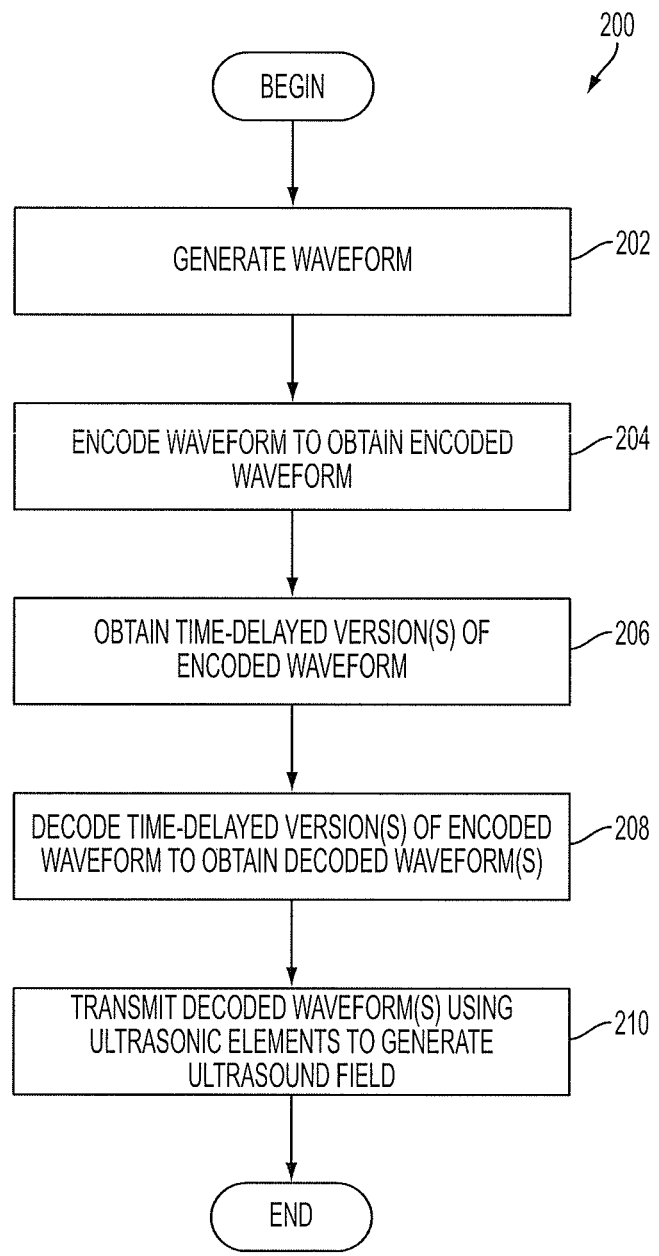
FIG. 2 is a flowchart of an illustrative process for generating and transmitting an ultrasound field using a single substrate ultrasound device, in accordance with some embodiments described herein.

Aspects of operation of the circuitry illustrated in FIG. 1 are further explained below with reference to FIG. 2, which is a flowchart of an illustrative process 200 for generating and transmitting an ultrasound field by using a single substrate ultrasound device to generate and transmit one or more ultrasound waveforms that form the ultrasound field. Process 200 may be performed by any suitable single substrate ultrasound device (e.g., ultrasound device 100 described with reference to FIG. 1).

Process 200 begins at 202, where a waveform is generated by a waveform generator. The waveform generator may be any suitable type of generator and may be integrated with the substrate of the single substrate ultrasound device such as waveform generator 102 described with reference to FIG. 1. The generated waveform may be of any suitable type (e.g., a waveform comprising one or more impulses, a continuous wave, a chirp, a coded excitation, etc.). In some embodiments, the waveform may be generated as part of process 200. In other embodiments, the waveform may have been generated prior to performance of 202 of process 200 (by the waveform generator or any other suitable circuitry) and may be loaded (or otherwise accessed) as part of stage 202 of process 200.

Next, process 200 proceeds to 204, where the waveform obtained at 202 is encoded by encoding circuitry to obtain an encoded waveform. The encoding circuitry may be of any suitable type and may be integrated with the substrate of the single substrate ultrasound device such as encoding circuitry 103 described with reference to FIG. 1. The waveform may be encoded using any suitable encoding technique (e.g., a compressive technique, a lossy encoding technique, a lossless encoding technique, any of the encoding techniques described herein, etc.). In some embodiments, the encoded waveform may consist of fewer bits than the waveform obtained at 202.

After an encoded waveform is obtained at 204, process 200 proceeds to 206 where one or more time-delayed versions or instances of the encoded waveform may be obtained. Any suitable number of time-delayed versions of the encoded waveform may be obtained. In some embodiments, a time-delayed version of the encoded waveform may be obtained for each of multiple ultrasound transmission units integrated with the single substrate device. As one non-limiting example, a time-delayed version of the encoded waveform may be obtained for each of some or all of the ultrasound transmission units in an ultrasound circuitry module formed on the substrate of the ultrasound device. As another non-limiting example, a time-delayed version of the encoded waveform may be obtained for each of some or all of the ultrasound transmission units in multiple ultrasound circuitry modules formed on the substrate of the ultrasound device.

In some embodiments, the time-delayed instance(s) of the encoded waveform may be obtained by using delay mesh circuitry integrated on the substrate of the single substrate ultrasound device. For example, delay mesh circuitry 105 (described with reference to FIG. 1) may be used to perform stage 206 of process 200. The delay mesh circuitry may comprise multiple delay mesh units and may be configured to generate the time-delayed version(s) of the encoded waveform at least in part by propagating the encoded waveform among the delay mesh units. Each of the delay mesh units may be configured to delay the waveform passing through it by a configurable amount. As described in more detail below, operation of the delay mesh may be controlled by one or multiple parameters that control how the delay mesh units in the delay mesh network communicate with one another and the manner in which each delay mesh unit operates to delay the signals passing through that unit.

After the time-delayed version(s) of the encoded waveform are obtained at 206, process 200 proceeds to 208 where the time-delayed version(s) of the encoded waveform are decoded by decoding circuitry to obtained one or more decoded waveforms. The decoding circuitry may be of any suitable type and may be integrated with the substrate of the single substrate ultrasound device such as decoding circuitry 109 described with reference to FIG. 1. The decoding may be performed using any suitable decoding technique (examples of which are described herein). In some embodiments, a decoded waveform may consist of more bits than the time-delayed version of the encoded waveform used to obtain it.

After the decoded waveform(s) are obtained at 208, process 200 proceeds to 210 where the decoded waveforms are used to drive the one or more ultrasound elements (e.g., ultrasound elements 111 described with reference to FIG. 1) to generate an ultrasound signals. At least some (e.g., all) of the decoded waveforms may drive multiple ultrasound elements in parallel to generate a desired ultrasound wave. Examples of ultrasound waves that may be generated in this way have been described above.

It should be appreciated that process 200 is illustrative and that variations are possible. For example, in some embodiments, process 200 may be performed without the performing encoding and decoding at 204 and 208, respectively. In such embodiments, a waveform generated would be generated at 202 and, at 206, one or more time-delayed version(s) of the generated waveform would be obtained. In turn, the time-delayed version(s) of the generated waveform would be provided to the ultrasound transducer(s) for transmission at 210.

It should also be appreciated that process 200 may be performed by each of one or multiple ultrasound circuitry modules of an ultrasound device that comprises multiple such modules. One embodiment of a single substrate ultrasound device comprising multiple ultrasound circuitry modules is shown in FIG. 3.

Figure 3:
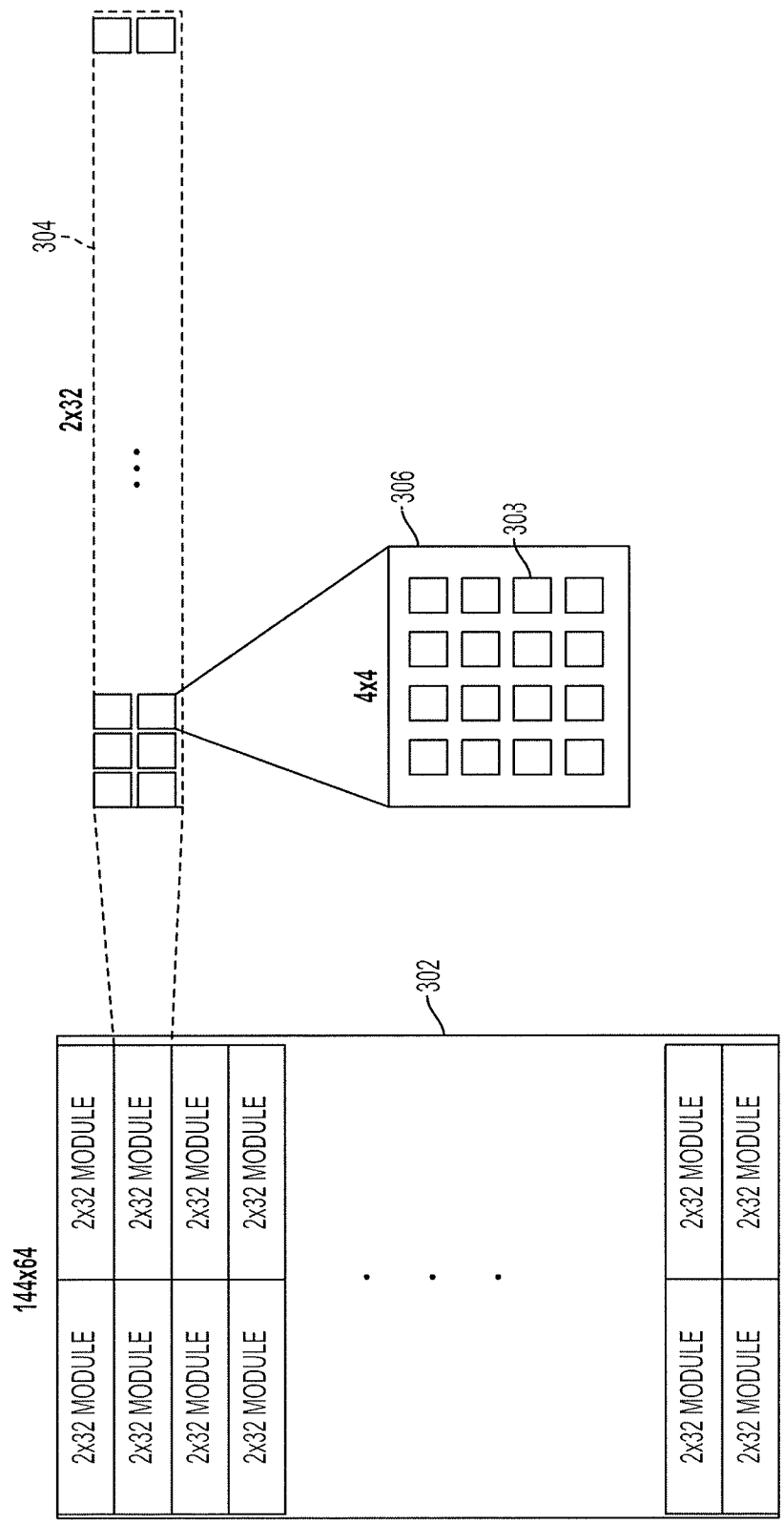
FIG. 3 shows an illustrative arrangement of ultrasonic transducers integrated with the substrate of a single substrate ultrasound device, in accordance with some embodiments described herein.

FIG. 3 shows substrate 302 (e.g., a semiconductor substrate) of an ultrasound device having multiple ultrasound circuitry modules 304 formed thereon. As shown, an ultrasound circuitry module 304 may comprise multiple ultrasound elements 306. An ultrasound element 306 may comprise multiple ultrasonic transducers 308.

In the illustrated embodiment, substrate 302 comprises 144 modules arranged as an array having 72 rows and 2 columns. However, it should be appreciated that a substrate of a single substrate ultrasound device may comprise any suitable number of ultrasound circuitry modules (e.g., at least two modules, at least ten modules, at least 100 modules, at least 1000 modules, at least 5000 modules, at least 10,000 modules, at least 25,000 modules, at least 50,000 modules, at least 100,000 modules, at least 250,000 modules, at least 500,000 modules, between two and a million modules, etc.) that may be arranged as an two-dimensional array of modules having any suitable number of rows and columns or in any other suitable way.

In the illustrated embodiment, each module comprises 64 ultrasound elements arranged as an array having two rows and 32 columns. However, it should be appreciated that an ultrasound circuitry module may comprise any suitable number of ultrasound elements (e.g., one ultrasound element, at least two ultrasound elements, at least four ultrasound elements, at least eight ultrasound elements, at least 16 ultrasound elements, at least 32 ultrasound elements, at least 64 ultrasound elements, at least 128 ultrasound elements, at least 256 ultrasound elements, at least 512 ultrasound elements, between two and 1024 elements, at least 2500 elements, at least 5,000 elements, at least 10,000 elements, at least 20,000 elements, between 1000 and 20,000 elements, etc.) that may be arranged as a two-dimensional array of ultrasound elements having any suitable number of rows and columns or in any other suitable way.

In the illustrated embodiment, each ultrasound element comprises 16 ultrasonic transducers arranged as a two-dimensional array having four rows and four columns. However, it should be appreciated that an ultrasound element may comprise any suitable number of ultrasonic transducers (e.g., one, at least two, at least four, at least 16, at least 25, at least 36, at least 49, at least 64, at least 81, at least 100, between one and 200, etc.) that may be arranged as a two dimensional array having any suitable number of rows and columns (square or rectangular) or in any other suitable way.

It should be appreciated that any of the components described above (e.g., ultrasound transmission units, ultrasound elements, ultrasound transducers) may be arranged as a one-dimensional array, as a two-dimensional array, or in any other suitable manner.

As previously described, an ultrasound circuitry module may comprise circuitry in addition to one or more ultrasound elements. In some embodiments, an ultrasound circuitry module may comprise one or more waveform generators (e.g., two waveform generators, four waveform generators, etc.), encoding circuitry (e.g., encoding circuitry 103), delay mesh circuitry (e.g., delay mesh circuitry 105), and/or decoding circuitry (e.g., decoding circuitry 109 comprising one or more decoding circuits). These examples of circuitry that may be part of an ultrasound circuitry module are illustrative and are not limiting, as an ultrasound circuitry may additionally or alternatively comprise any other suitable circuitry.

In some embodiments, a single substrate ultrasound device may comprise module interconnection circuitry integrated with the substrate and configured to connect ultrasound circuitry modules to one another to allow data to flow among the ultrasound circuitry modules. For example, the device module interconnection circuitry may provide for connectivity among adjacent ultrasound circuitry modules. In this way, an ultrasound circuitry module may be configured to provide data to and/or received data from one or more other ultrasound circuitry modules on the device.

In embodiments where ultrasound circuitry modules are configured to communicate with one another, a time-delayed version of a waveform generated by a waveform generator (and optionally encoded) in one ultrasound circuitry module may be propagated to and (after decoding if encoding was performed) transmitted by one or more ultrasound elements in one or more other ultrasound circuitry modules. As one non-limiting example, an ultrasound field may be generated by using a single waveform generator disposed near the center of the substrate by propagating the generated waveform outward through all the ultrasound circuitry modules. The propagation of a signal originating in a first ultrasound circuitry module to a second circuitry module may be performed at least in part by propagating the signal through the delay mesh of the first ultrasound circuitry module, the delay mesh of the second circuitry module, and the delay mesh(es) of any ultrasound circuitry modules separating the first and second ultrasound circuitry modules. As such, it should be appreciated that module interconnection circuitry may comprise circuitry connecting the delay meshes of different ultrasound circuitry modules.

Figure 4:
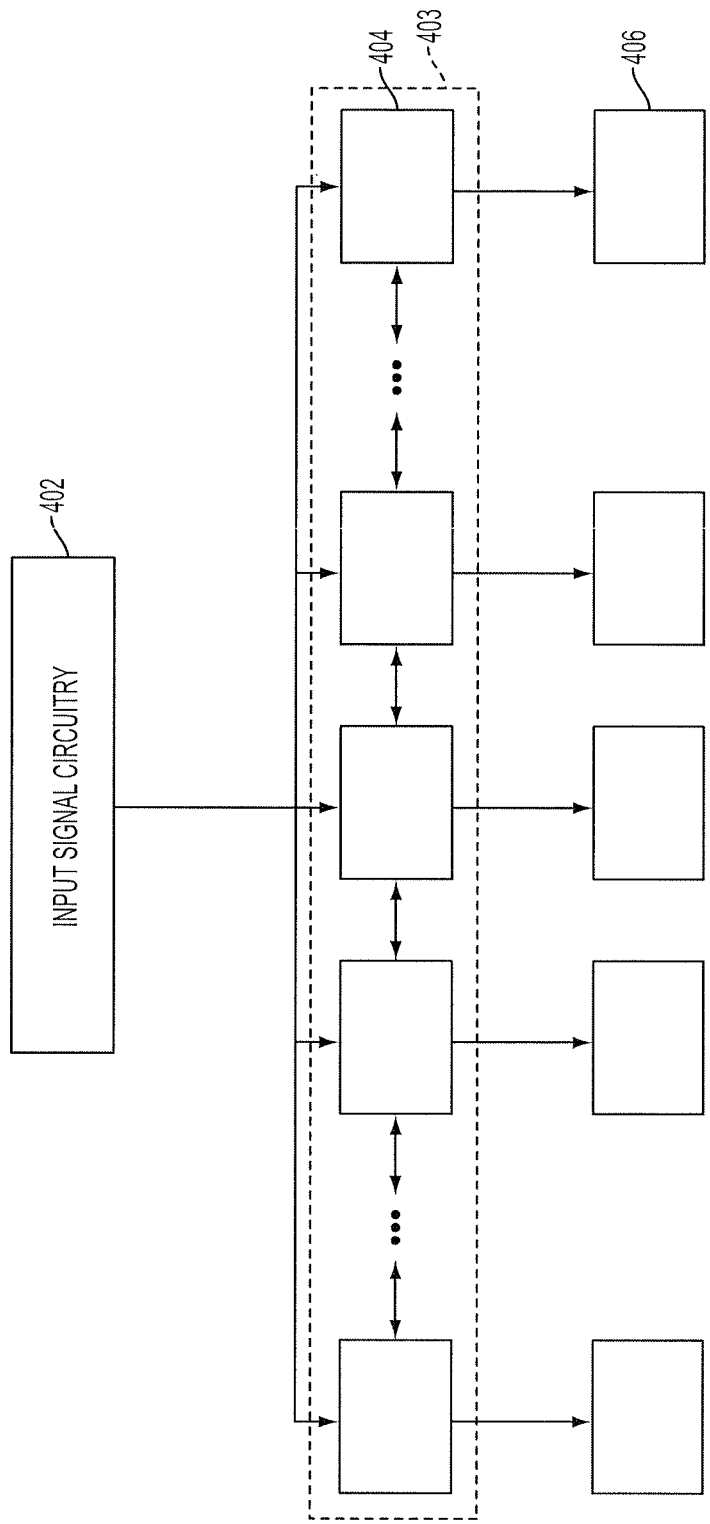
FIG. 4 illustrates delay mesh circuitry comprising multiple delay mesh units, in accordance with some embodiments described herein.

Aspects of delay mesh circuitry (e.g., delay mesh circuitry 105 of FIG. 1) may be further understood with reference to FIG. 4 that illustrates delay mesh circuitry 403 comprising a plurality of delay mesh units 404. Delay mesh circuitry 403 may be configured to receive input signals from input circuitry 402 and provide output signals to ultrasound transmission units 406. In the illustrated embodiment, an input of each delay mesh unit 404 is coupled to an output of input signal circuitry 402, which is configured to provide one or more input signals to delay mesh units 404. An output of each delay mesh unit 404 is coupled to an input of a corresponding ultrasound transmission unit 406. Accordingly, delay mesh units 404 in delay mesh circuitry 403 may be configured to receive an input signal from input signal circuitry 402, generate multiple time-delayed versions of the input signal, and provide the generated time-delayed versions of the input signal to the ultrasound transmission units 406.

In some embodiments, input signal circuitry 402 comprises encoding circuitry (e.g., encoding circuitry 103 of FIG. 1) configured to provide encoded signals as input signals to delay mesh circuitry 403. The encoding circuitry may provide, as input signals to delay mesh units 404, one or more encoded waveforms obtained by encoding one or more waveforms generated by one or multiple waveform generators (e.g., waveform generator 102 of FIG. 1). Additionally or alternatively, input signal circuitry 402 may comprise one or multiple waveform generators (e.g., one waveform generator, two waveform generators, three waveform generators, etc.) configured to generate waveforms and provide them to the delay mesh units 404 as input signals.

Delay mesh circuitry 403 may be coupled to any suitable number of ultrasound transmission units 406 (e.g., at least one unit, at least two units, at least four units, at least eight units, at least sixteen units, at least 32 units, at least 64 units, at least 128 units, at least 256 units, some or all of the ultrasound transmission units in a single ultrasound circuitry module, some or all of the ultrasound transmission units in multiple ultrasound circuitry modules, etc.).

In the illustrated embodiment, an output of each delay mesh unit 404 is coupled to an input of a single corresponding ultrasound transmission unit 406. However, in some embodiments, one or multiple delay mesh units 404 may be configured to provide output signals to multiple ultrasound transmission units 406, as aspects of the technology described herein are not limited in this respect. This is discussed further with reference to FIG. 5B.

Delay mesh circuitry 403 comprises a network of interconnected delay mesh units 404. As described in more detail below, each delay mesh unit 404 may be configured to receive one or more input signals from one or more sources (e.g., one or more other delay mesh units and/or input signal circuitry 402), receive one or more control signals, perform one or more actions on the input signal(s) based, at least in part, on the control signals to produce one or more output signals, and provide the output signals to one or multiple destinations (e.g., one or more other delay mesh units 404 and/or one or more ultrasound transmission units 406).

Delay mesh circuitry 403 may comprise any suitable number of delay mesh units. In some embodiments, delay mesh circuitry 403 may comprise at least as many delay mesh units as the number of ultrasound transmission units to which delay mesh circuitry 403 is coupled. As one non-limiting example, delay mesh circuitry 403 may comprise the same number of delay mesh units as the number of ultrasound transmission units to which delay mesh circuitry 403 is coupled. As another non-limiting example, delay mesh circuitry 403 may comprise at least twice (or three times, or four time, or five times, etc.) as many delay mesh units as the number of ultrasound transmission units to which delay mesh circuitry 403 is coupled.

A delay mesh unit may be configured to perform any of numerous types of actions on an input signal including, but not limited to, any one or more of: delaying the input signal before outputting it to one or more destinations, selecting and providing a portion of the input signal as the output signal to one or more destinations, and performing any suitable bit-level arithmetic and/or logical operation on the input signal.

A delay mesh unit may be configured to output different versions of the input signal to different destinations. For example, in some embodiments, a delay mesh unit may be configured to delay the input signal by a first amount and provide the resulting delayed signal to one or more delay mesh units, and delay the input signal by a second amount and provide the resulting delayed signal to one or more ultrasound transmission units.

Delay mesh units 404 may be configured to communicate with (e.g., receive input from and/or provide output to) one another. In some embodiments, a delay mesh unit may be configured to communicate with one or more adjacent delay mesh units in the delay mesh circuitry. For example, as shown in FIG. 4, a delay mesh unit is configured to communicate with its left and right neighbors. As another example, if the delay mesh units were arranged in a two-dimensional grid, a delay mesh unit may be configured to communicate with one or more of its left, right, top, and bottom neighbors. It should be appreciated, however, that a delay mesh unit is not limited communicating with its neighboring delay mesh units and, additionally or alternatively, may be configured to communicate with any other delay mesh unit in the delay mesh circuitry (e.g., diagonal neighbors, neighbors of neighbors, delay mesh units beyond neighbors, delay mesh units in a same row, delay mesh units in a same column, etc.).

Delay mesh circuitry may be controlled to produce a desired set of time-delayed versions of the delay mesh input signal in response to one or more delay mesh circuitry control signals. In some embodiments, delay mesh circuitry may be configured to produce a different set of time-delayed versions of the same delay mesh input signal in response to different delay mesh circuitry control signals. In some embodiments, delay mesh circuitry may be controlled at varying degrees of precision (e.g., within a desired time period, to within a desired number of clock cycles, to within a specified phase of the input waveform, etc.) to produce delayed versions of the delay mesh input signal.

Figure 5A:
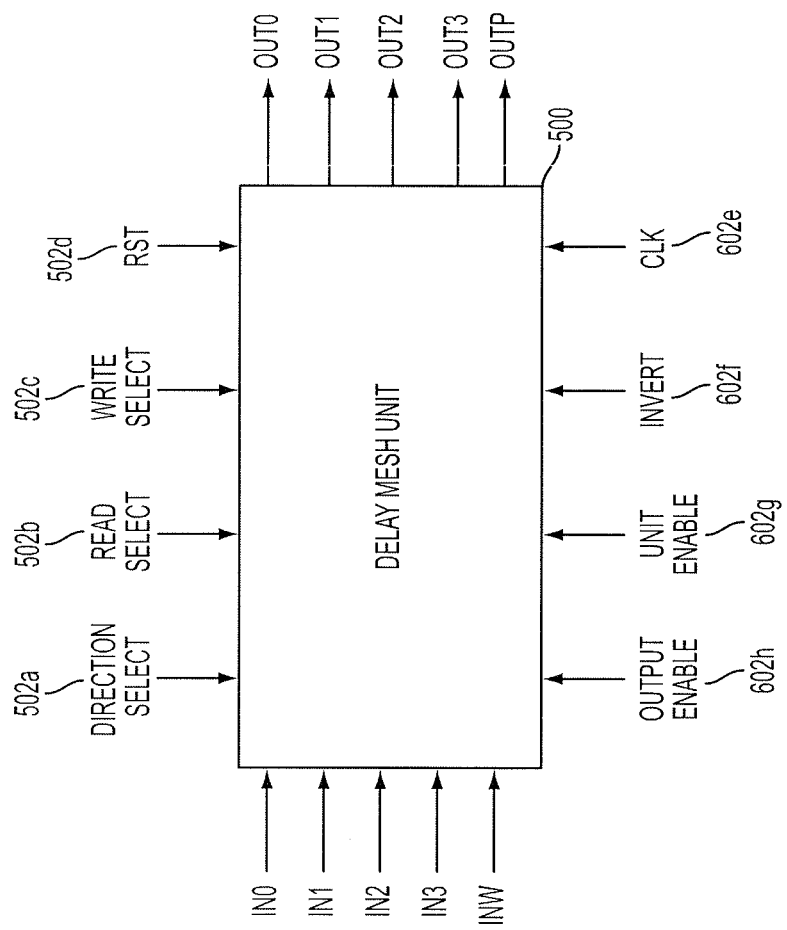
FIG. 5A illustrates the inputs and outputs of an illustrative delay mesh unit of a delay mesh, in accordance with some embodiments described herein.

A delay mesh circuitry control signal may comprise one or more delay mesh unit control signals for controlling individual delay mesh units in the delay mesh. A delay mesh unit control signal may control various aspects of how a delay mesh unit operates. FIG. 5A illustrates portions of a delay mesh unit control signal applied to delay mesh unit 500 (shown outside of any delay mesh circuitry).

In some embodiments, a delay mesh unit control signal may specify the source from which the delay mesh unit is to receive an input signal. For example, the delay mesh unit control signal for a delay mesh unit may specify another delay mesh unit as the source from which the delay mesh unit is to receive an input signal or may select delay mesh input circuitry (e.g., a waveform generator, an encoder encoding output of a waveform generator, etc.) as the source from which the delay mesh unit is to receive an input signal. As shown in FIG. 5A, for instance, a delay mesh unit control signal comprises portion 502a for controlling selection of the source from which the delay mesh unit 500 is to receive an input signal. In the embodiment of FIG. 5A, portion 502a controls selection of the source (e.g., by controlling a multiplexer) from among four neighboring delay mesh units and a waveform generator. In other embodiments, portion 502a may control selection of the source from among any suitable number of delay mesh units (neighboring or not) and/or any suitable number of waveform generators, as aspects of the technology described herein are not limited in this respect.

A delay mesh unit may comprise a buffer (e.g., implemented as a shift register, addressable memory, and/or in any other suitable way) configured to store one or more input signals received by the delay mesh unit (e.g., from another delay mesh unit, from a waveform generator, etc.). Accordingly, in some embodiments, a delay mesh unit control signal may specify the location(s) in the buffer to which the input signal is to be written. As shown in FIG. 5A, for instance, a delay mesh unit control signal comprises portion 502c (termed "write select") for specifying the location(s) in the buffer to which the input signal is to be written. As one non-limiting example, in embodiments where the buffer is implemented as a shift register, portion 502c may specify a location within the shift register to which the input signal is to be written. As another non-limiting example, in embodiments where the buffer is implemented as addressable memory, portion 502c may specify an initial location starting from which the input signal is to be written contiguously to the buffer or portion 502c may specify a set of locations to which to write the input signal.

In some embodiments, a delay mesh unit control signal may specify the location(s) in the buffer from which a signal to be output is to be read. As shown in FIG. 5A, for instance, a delay mesh unit control signal comprises portion 502b (termed "read select") for specifying the location(s) in the buffer from which the input signal is to be read. As one non-limiting example, in embodiments where the buffer is implemented as a shift register, portion 502b may specify a location within the shift register from which the output signal is to be read. As another non-limiting example, in embodiments where the buffer is implemented as addressable memory, portion 502b may specify an initial location starting from which the input signal is to be read contiguously from the buffer or portion 502b may specify a set of locations to which to read the output signal.

As may be appreciated from the above, controlling location(s) in a buffer of a delay mesh unit to which to write an input signal and the locations from which to read an output signal from the buffer allows for specifying an amount of time (e.g., by number of clock samples) by which to delay a signal coming into the delay mesh unit before outputting it to a destination (e.g., another delay mesh unit and/or an ultrasound transmission unit). In this way, each delay mesh unit in delay mesh circuitry may be controlled to delay respective input signals by specified amounts. It should be appreciated that different delay mesh units may be controlled to delay respective incoming input signals by different amounts, as aspects of the technology provided herein are not limited in this respect.

Additionally, a delay mesh unit control signal may comprise a reset signal (e.g., portion 502d in FIG. 5A termed "RST") to reset the delay mesh unit, a clock signal (e.g., portion 502e in FIG. 5A termed "CLK"), a signal indicating whether or not to invert the waveform being output to the ultrasound transmission unit (see e.g., portion 502f in FIG. 5A termed "invert"), a signal indicating whether to enable or disable the delay mesh unit (see e.g., portion 502f in FIG. 5A termed "unit enable"), and a signal indicating whether to enable or disable output to one or more output destinations such as a pulser in a corresponding ultrasound transmission unit (see e.g., portion 502h in FIG. 5A termed "output enable") or one or more other delay mesh units. The unit enable and output enable signals may be used to power down the delay mesh unit or to enable its use as a buffer but suppress the output to one or more output destinations such as the corresponding ultrasound transmission unit(s).

Figure 5B:
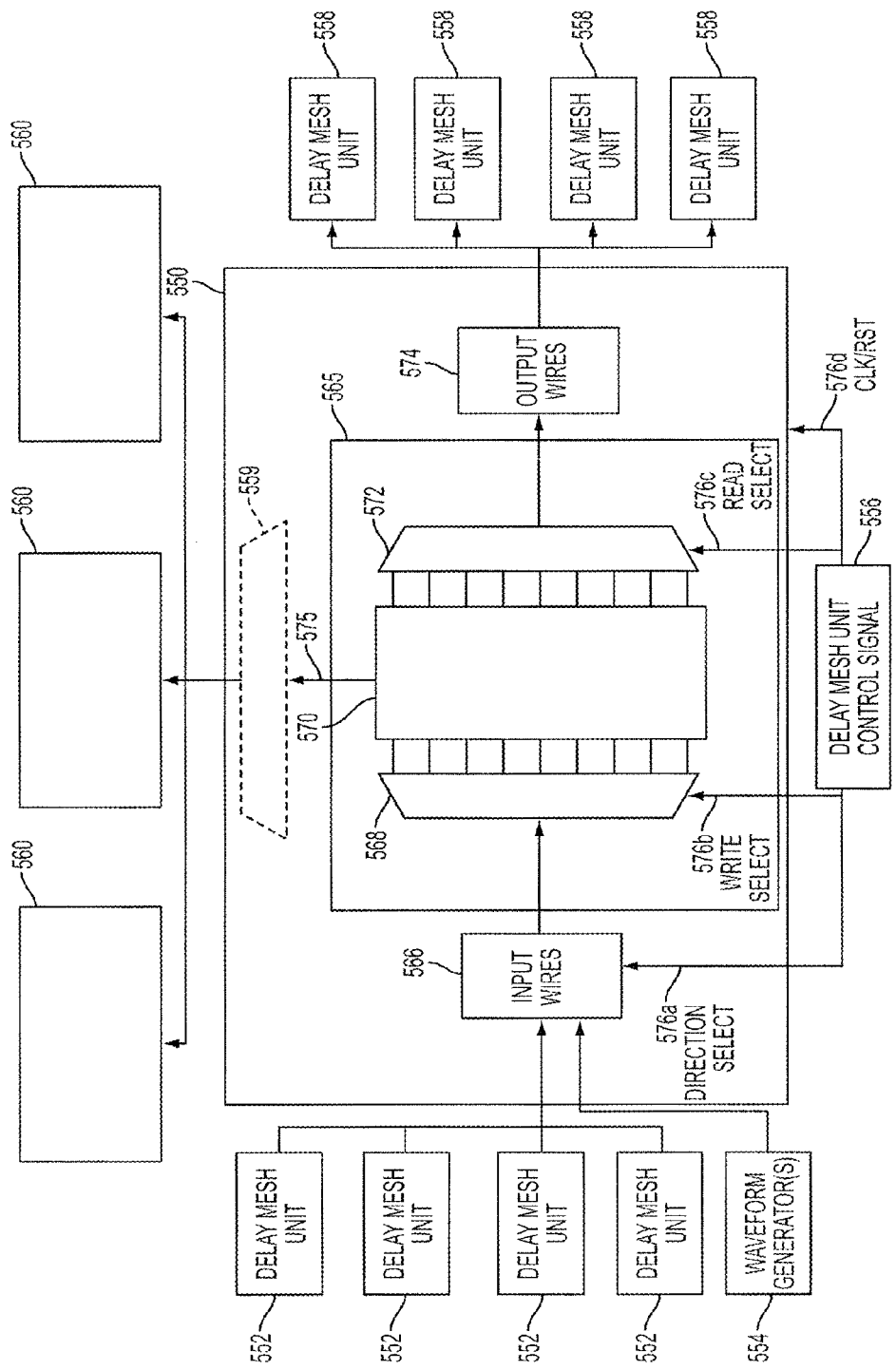
FIG. 5B illustrates the architecture of an illustrative delay mesh unit, in accordance with some embodiments described herein.

FIG. 5B provides the architecture of an illustrative delay mesh unit 550, in accordance with some embodiments described herein. Delay mesh unit 550 may be any suitable delay mesh unit and, for example, may be one of delay mesh units 404 described with reference to FIG. 4. Delay mesh unit 550 may be controlled by one or more delay mesh unit control signals. As shown, delay mesh unit 550 is controlled by delay mesh control signal 556. Delay mesh control signal 556 comprises portions 576a, 576b, 576c, which are described in more detail below, and portion 576d comprising the clock and reset signals previously described. Delay mesh unit control signal 556 may be provided by one or more "on-chip" components integrated with the single substrate device on which delay mesh unit 550 is integrated on, by one or more "off-chip" components such as one or more computing device(s) coupled to the single substrate ultrasound device, but not integrated with it, or by one or more on-chip and one or more off-chip components.

Delay mesh unit 550 comprises input wires 566 controlled by delay mesh control signal portion 576a (termed "direction select") to select the source from which delay mesh unit 550 receives input. In some embodiments, input wires 566 may comprise at least one multiplexer controllable by portion 576a to select an input source. As shown, delay mesh unit 550 may be controlled to receive an input signal from one of neighboring delay mesh units 552 or from other input circuitry such from one or more waveform generators (shown as waveform generator(s) 554) or encoding circuitry (not shown). It should be appreciated that a delay mesh unit is not limited to receiving input only from one or more neighboring delay mesh units (e.g., units to the left, to the right, above and below the delay mesh unit) and, for example, may be configured to receive input from any other delay mesh unit part of delay mesh circuitry in the single substrate ultrasound device. For example, in an embodiment where the delay mesh units are arranged in a two-dimensional grid, a delay mesh unit may be configured to receive input from another delay mesh unit located at a diagonal to the delay mesh unit.

Delay mesh unit 550 further comprises delay unit 565 used, at least in part, for storing input signals received by delay mesh unit 550 via input wires 566. The circuitry in delay mesh unit 550, but not in delay unit 565 may be referred to as "mesh linkage." As shown in FIG. 5B, mesh linkage includes input wires 566, output wires 574, and output wire 575.

Delay unit 565 comprises buffer 570, write select circuitry 568 configured to control (in response to "write select" delay mesh unit control signal portion 576b) the location(s) in buffer 570 to which an input signal received by delay mesh unit 550 is to be written, and read select circuitry 572 configured to control (in response to "read select" portion 576c) the location(s) in buffer 570 from which to read a signal to be provided as an output signal to one or more output destinations. It should be appreciated that delay unit 565 is one embodiment of a delay unit and that a delay unit may be implemented in any other suitable way, as aspects of the technology described herein are not limited in this respect.

In some embodiments, buffer 570 may be implemented as a shift register. In such embodiments, each of write select circuitry 568 and read select circuitry 572 may be implemented using one or more multiplexers respectively configured to select the location(s) in buffer 570 to which to write an input signal and from which to read an output signal. In other embodiments, buffer 570 may be implemented as addressable memory. In such embodiments, each of write select circuitry 568 and read select circuitry 572 may be configured to use one or more pointers to select the location(s) in buffer 570 to which to write an input signal and from which to read an output signal. The pointer may be incremented in any suitable way, as aspects of the technology provided herein are not limited in this respect. It should be appreciated that buffer 570 is not limited to being implemented as a shift register or addressable memory and may be implemented in any other suitable way.

Regardless of the manner in which buffer 570 is implemented, buffer 570 may be configured to store an input signal of any suitable size. As one non-limiting example, buffer 570 may be configured to store 10 values or less, 20 values or less, values bits or less, 50 values or less, 100 values or less between 10-100 values, between 50 and 500 values, between 100 and 1000 values, between 500 and 1000 values or any other suitable number of values. In turn, each value may consist of any suitable number of bits (e.g., one bit, two bits, four bits, eight bits, 16 bits, 32 bits, 64 bits, 128 bits, 256 bits, etc.).

An output signal from delay mesh unit 550 may be provided to one or more output destinations. As shown, delay mesh unit 550 comprises output wires 574 configured to provide an output signal from buffer 570 to one or more delay mesh units 558 (which may be the same as or different from delay mesh units 552). Output wires 574 may comprise any suitable number of wires to enable providing the output signal to any suitable number of delay mesh units (e.g., one, two, three, four, five, etc.).

Additionally, delay mesh unit 550 may be configured to provide an output signal from buffer 570 to one or more ultrasound transmission units 560. Ultrasound transmission unit may be any suitable ultrasound transmission unit and, for example, may be ultrasound transmission unit 406 described with reference to FIG. 4. In the illustrated embodiment, delay mesh unit 550 is configured to provide an output signal, via wire 575, from buffer 570 to multiplexer 559, which may be controlled to select one of ultrasound transmission units 560 to which to provide the output signal. Multiplexer 559 may be of any suitable type and may be configured to select any one (of any suitable number) of ultrasound transmission units 560 to which to provide the output signal. For example, multiplexer 559 may be configured to select any one of two or three or four or five ultrasound transmission units 560. In other embodiments, delay mesh circuitry may not include multiplexer 559 (as indicated by the dashed lines of multiplexer 559) and delay mesh unit 550 may be configured to provide an output signal from buffer 570 directly to ultrasound transmission unit 560 via wire 575.

It should be appreciated that delay mesh unit 550 may provide different output signals to delay mesh unit(s) 558 and ultrasound transmission unit(s) 560. For example, delay mesh unit 550 may provide to delay mesh unit(s) 558 an output signal obtained by delaying an input signal by a first amount and provide to ultrasound transmission unit(s) 560 a different output signal obtained by delaying the input by a second amount different from the first amount. Though, in some embodiments, a delay mesh unit may output the same output signal to all output destinations (e.g., provide the same output signal to delay mesh unit(s) 558 and ultrasound transmission unit(s) 560), as aspects of the disclosure provided herein are not limited in this respect.

Figure 6:
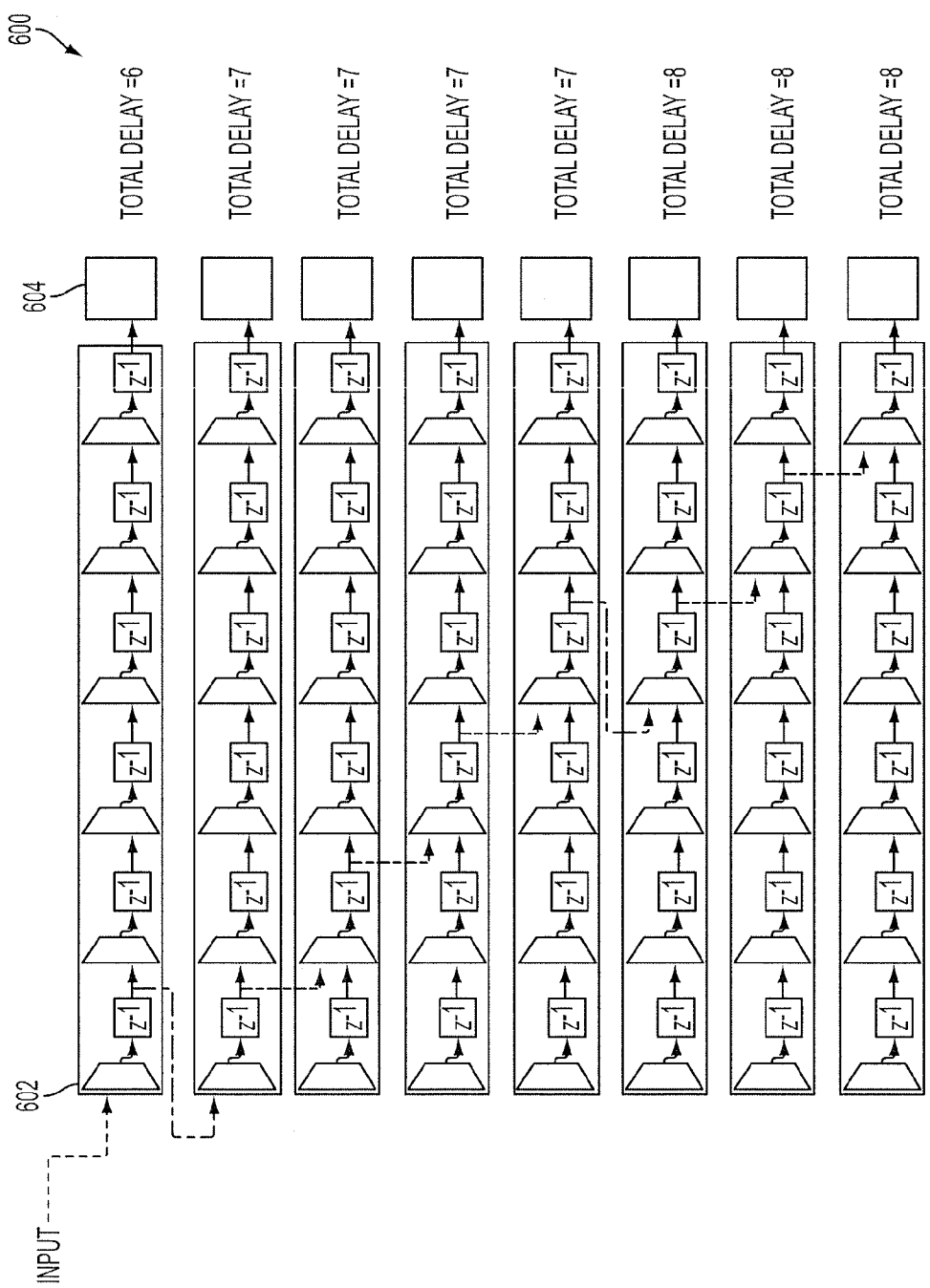
FIG. 6 shows an illustrative configuration of delay mesh circuitry comprising delay mesh units, in accordance with some embodiments described herein.

As described above, delay mesh circuitry may be configured to delay an input signal (e.g., a waveform output from a waveform generator) by propagating it through a plurality of delay mesh units in the delay mesh circuitry. Each delay mesh unit may be configured to delay a version of the input signal by a specified amount. This is further illustrated in FIG. 6, which shows illustrative delay mesh circuitry 600 comprising delay mesh units 602 (each row of FIG. 6 corresponds to a single delay mesh unit). Each delay mesh unit 602 is configured to provide an output signal to respective ultrasound transmission unit 604. Each delay mesh unit 602 comprises a buffer implemented as a sequence of shift registers and multiplexers. Each dashed arrow leaving a first delay mesh unit and entering a second delay mesh unit indicates the location in the buffer of the first delay mesh unit from which a signal is being read and the location in the buffer of the second delay mesh unit to which the signal read from the first delay mesh unit is being written. As described above, the read and write locations may be specified by using delay mesh unit control signals—the arrows shown in FIG. 6 provide a representation of one set of delay mesh unit control signals that specify the read and write locations for the delay mesh units 602 shown in FIG. 6. That is, FIG. 6 illustrates mesh linkage where read and write locations of the delay mesh unit s 602 are specified by a set of delay mesh unit control signals.

The net result of these delay mesh control signals leads to the delays of the input signal illustrated in FIG. 6. As shown, a version of the signal that is input to delay mesh circuitry 600 propagates along the top delay mesh unit 602 and is delayed by six time units (where a single time unit corresponds to, for example, one or multiple clock cycles) until it propagates to the output at the top delay mesh unit. Versions of the delay mesh input signal that propagate through the delay mesh circuitry 600 (e.g., starting with the top delay mesh unit and through one or more of the second through the fifth delay mesh units) and are output from any of the second through the fifth delay mesh units are delayed by seven time units. Versions of the delay mesh input signal that propagate through the delay mesh circuitry 600 (e.g., starting with the top delay mesh unit and subsequently along one or more of the second through the eighth delay mesh units) and are output from any of the sixth through the eight delay mesh units are delayed by eight time units.

FIGS. 7, 8A, 8B, 8C, and 8D illustrate operation of encoding and decoding circuitry that may be part of the circuitry of a single substrate ultrasound device, in accordance with some embodiments described herein. As described above, encoding circuitry may be configured to implement a compressive encoding so that an encoded signal consists of fewer bits than the input signal that was encoded. In turn, the decoding circuitry may be configured to decompress the encoded signal to obtain a decoded signal having the same number of bits (or greater number of bits) as the input signal that was encoded. In some embodiments, the encoding circuitry may be configured to encode a K-state signal (where K is any integer greater than or equal to 2) to obtain an encoded L-state signal (where L is any integer greater than or equal to 1 with L less than K). In turn, the decoding circuitry may be configured to decode an L-state signal to obtain a K-state encoded signal.

Figure 7:
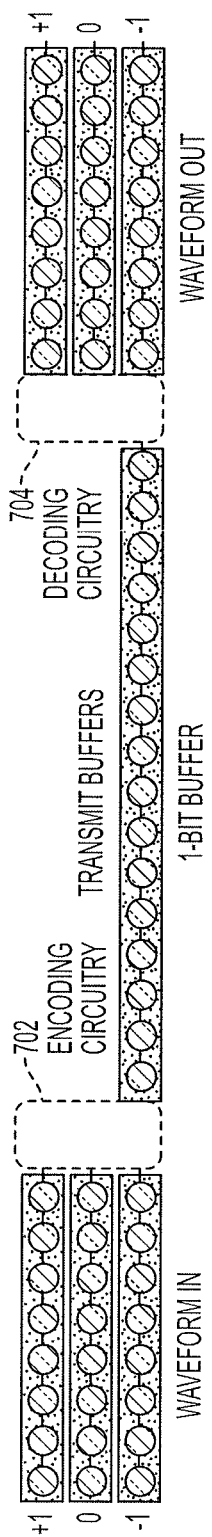
FIG. 7 illustrates operation of encoding and decoding circuitry that may be part of the circuitry of a single substrate ultrasound device, in accordance with some embodiments described herein.

As one non-limiting example illustrated in FIG. 7, encoding circuitry 702 may be configured to encode a three-state signal (a signal whose states may be represented using two bits) to obtain two-state signal (i.e., a signal whose states may be represented using one bit) and decoding circuitry 704 may be configured to decode a two-state signal to obtain a three-state signal. Such an encoding/decoding may serve to reduce the amount of memory required to implement delay mesh circuitry. For example, delay mesh units in delay mesh circuitry may be implemented using smaller buffers when input signals provided to the delay mesh circuitry are encoded using a compressive encoding.

Figure 8A:
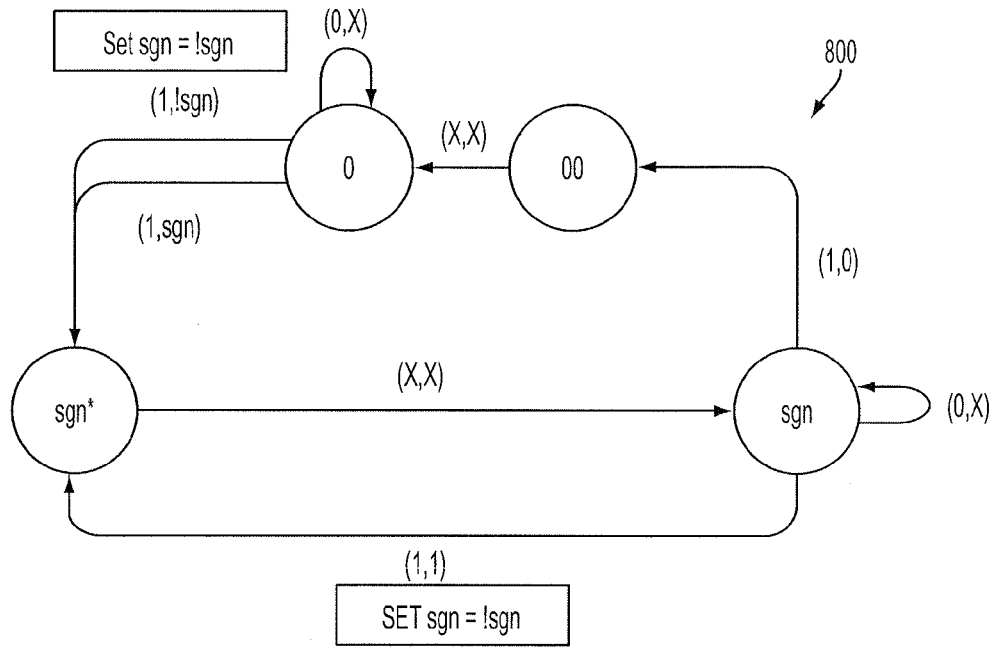
FIG. 8A is a finite state machine diagram illustrating the operation of one embodiment of encoding circuitry.
Figure 8B:
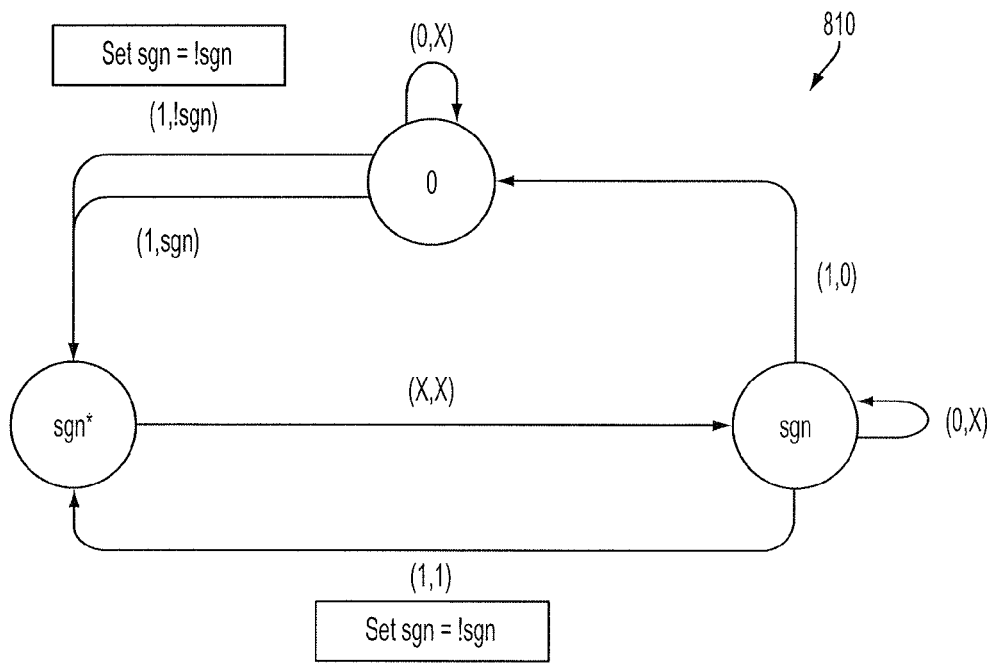
FIG. 8B is a finite state machine diagram illustrating the operation of one embodiment of decoding circuitry configured to decode signals encoded by the encoding circuitry whose operation is illustrated in FIG. 8A.

In some embodiments, encoding circuitry 702 and decoding circuitry 704 may operate as illustrated by the finite state machines shown in FIGS. 8A and 8B. FIG. 8A illustrates a finite state machine (FSM) 800 representing the operation of encoding circuitry 702, in some embodiments. FIG. 8B illustrates FSM 810 representing the operation of decoding circuitry 704, in some embodiments.

FSM 800 is configured to encode ternary waveforms taking on the values +1, 0, and −1 to obtain a binary waveform whose values represent state transitions. That is, at each position the waveform being encoded takes on the value of +1, 0, or −1, and the encoded waveform takes on the value of 0 or 1. In some embodiments, waveforms generated by a waveform generator in accordance with embodiments described herein may not contain consecutive transitions (this is essentially a constraint on the bandwidth of the ternary waveform as it disallows high frequency components). Accordingly, in some embodiments, FSM 800 may be configured to take advantage of the band limited nature of the waveform being encoded by encoding the waveform in a way that consecutive state transitions are not recoverable upon decoding, which results in (e.g., a 200%) a reduction of the length of the encoded waveform. As such, if FSM 800 were used to encode a waveform having two consecutive transitions, these transitions may not be recovered upon decoding. In this sense, the encoding/decoding scheme is lossy. For instance, if the waveform '0 +1 0 −1 0 −1 0' were encoded by FSM 800 and then decoded by FSM 810, the decoded waveform may be '0 +1+1 −1 −1 −1 −1'—the original waveform would not be recovered.

As shown, FSM 800 comprises four states: "0," "00," the "sgn" state, and the "sgn*" state. The "sgn" state corresponds to the value of a bit whose value is used to implement the FSM 800 and takes on the values of 0 or 1. Note that the value of the 'sgn' bit is changed along two of the state transitions. The "sgn*" state represents corresponding waveform values '+1' and '−1.' The arrows in the diagram represent state transitions between states. The numbers over each value represent the encoding. The symbol "X" refers to value that does not matter for purposes of encoding.

FSM 810 is configured to reverse the encoding performed by FSM 800. That is, FSM 810 is configured to decode binary waveforms taking on the values 0 and 1 (at each position in the waveform) to ternary waveforms taking on values of +1, 0, and −1 (at each position in the waveform). As shown, FSM 810 comprises three states: "0," the "sgn" state, and the "sgn*" state. As in the case of FSM 800, the "sgn" state takes on the values of 0 or 1, the "sgn*" state represents the corresponding waveform state '+1' and '−1', and the symbol "X" refers to a value that does not matter for purposes of decoding.

Figure 8C:
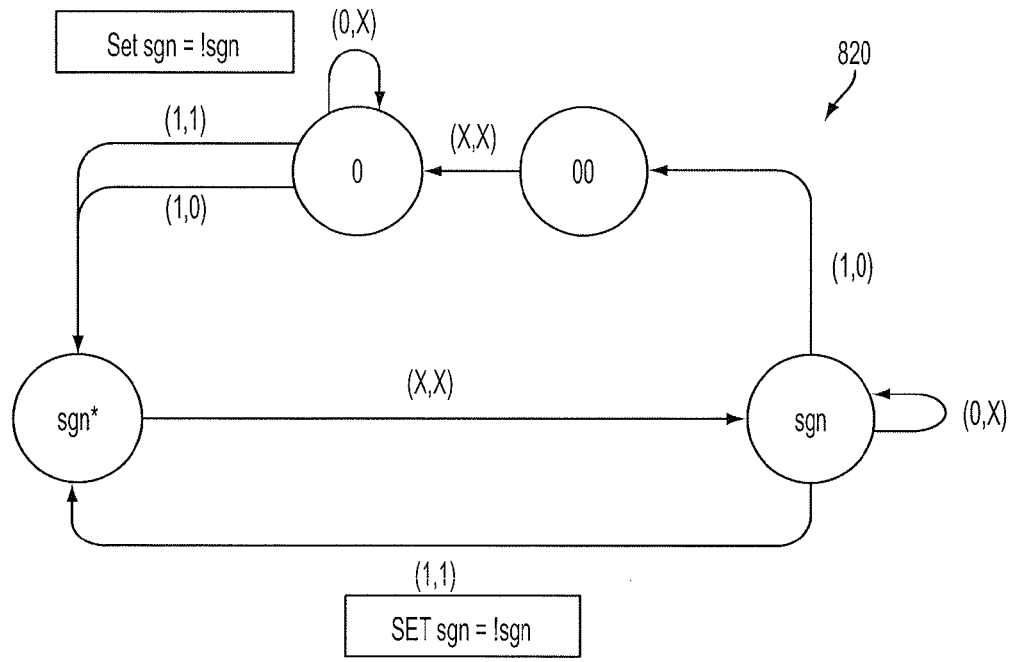
FIG. 8C is a finite state machine diagram illustrating the operation of another embodiment of encoding circuitry.
Figure 8D:
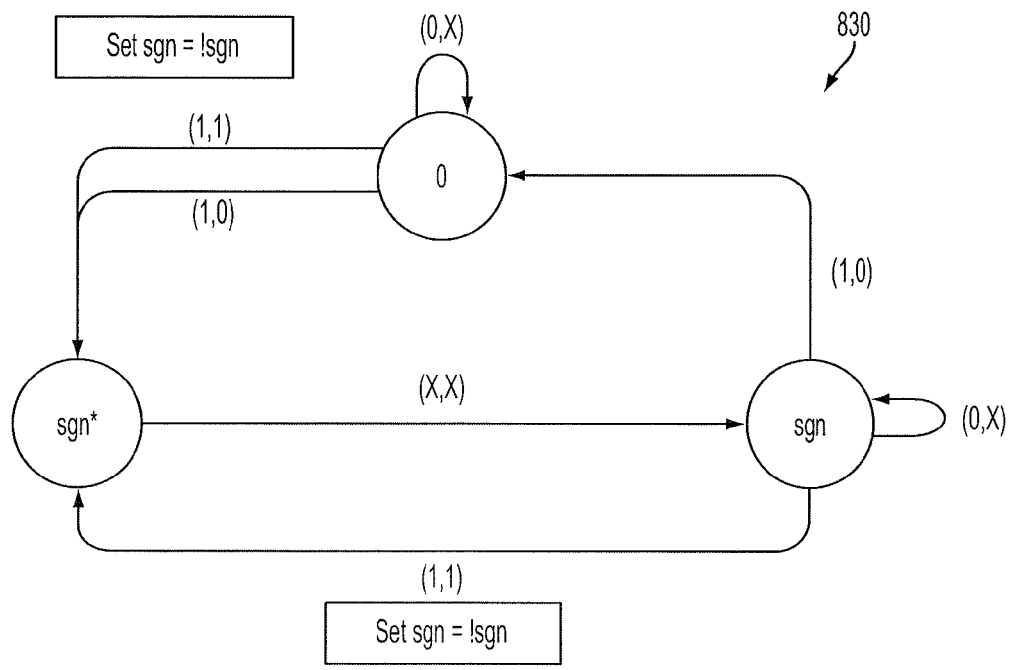
FIG. 8D is a finite state machine diagram illustrating the operation of another embodiment of decoding circuitry configured to decode signals encoded by the encoding circuitry whose operation is illustrated in FIG. 8C.

In some embodiments, encoding circuitry 702 and decoding circuitry 704 may operate as illustrated by the finite state machines shown in FIGS. 8C and 8D. FIG. 8C illustrates a finite state machine (FSM) 820 representing the operation of encoding circuitry 702, in some embodiments. The transition table illustrating operation of FSM 820 of FIG. 8C is shown in Table 1 below. FIG. 8D illustrates FSM 830 representing the operation of decoding circuitry 704, in some embodiments. The transition table illustrating operation of FSM 830 of FIG. 8D is shown in Table 2 below.

FSM 820 of FIG. 8C differs from FSM 800 of FIG. 8A in that the transitions between state "0" and the state "sgn*" have values that change from (1,!sgn) and (1,sgn) to (1,1) and (1,0), respectively. FSM 830 of FIG. 8D differs from FSM 810 of FIG. 8B in the same way. When encoding circuitry 702 and decoding circuitry 704 operate as illustrated by FSMs 820 and 830, respectively, changing one bit in the input waveform (e.g., the second bit of the input waveform) may result in the waveform being inverted upon being decoded (e.g., in a ternary waveform each of whose values takes on the value −1, 0, or 1, the effect of inversion is that each −1 becomes a +1 and each +1 becomes a −1). Such functionality may be advantageous, in embodiments which include encoding/decoding circuitry, because it affords an efficient way of inverting a waveform by using decoding circuitry in an ultrasound transmission unit; additional circuitry for performing the inversion is not required.

TABLE 1

State Transition Table for Invertible Encoder of FIG. 8C

| Encoded Values | Input Values | Current state | Next State | sgn value |
|---|---|---|---|---|
| 0, X | 0, 0 | 0 | 0 | X |
| 1, 1 | 0, −1 | 0 | sgn* | 0 |
| 1, 1 | 0, +1 | 0 | sgn* | 1 |
| 1, 0 | 0, +1 | 0 | sgn* | 0 |
| 1, 0 | 0, −1 | 0 | sgn* | 1 |
| X, X | +1, X | sgn* | sgn | 0 |
| X, X | −1, X | sgn* | sgn | 1 |
| 0, X | +1, +1 | sgn | sgn | 0 |
| 0, X | −1, −1 | sgn | sgn | 1 |
| 1, 1 | −1, +1 | sgn | sgn* | 0 |
| 1, 1 | +1, −1 | sgn | sgn* | 1 |
| 1, 0 | +1, 0 | sgn | 00 | 0 |
| 1, 0 | −1, 0 | sgn | 00 | 1 |
| X, X | 0, X | 00 | 0 | X |

TABLE 2

State Transition Table for Invertible Decoder of FIG. 8D

| Encoded Values | Decoded Value (of next state) | Current state | Next State | sgn value |
|---|---|---|---|---|
| 0, X | 0 | 0 | 0 | X |
| 1, 1 | −1 | 0 | sgn* | 0 |
| 1, 1 | +1 | 0 | sgn* | 1 |
| 1, 0 | +1 | 0 | sgn* | 0 |
| 1, 0 | −1 | 0 | sgn* | 1 |
| X, X | +1 | sgn* | sgn | 0 |
| X, X | −1 | sgn* | sgn | 1 |
| 0, X | +1 | sgn | sgn | 0 |
| 0, X | −1 | sgn | sgn | 1 |
| 1, 1 | −1 | sgn | sgn* | 0 |
| 1, 1 | +1 | sgn | sgn* | 1 |
| 1, 0 | 0 | sgn | 0 | X |

The aspects of the technology described herein may provide one or more benefits, some of which have been previously described. Now described are some non-limiting examples of such benefits. It should be appreciated that not all aspects and embodiments necessarily provide all of the benefits now described. Further, it should be appreciated that aspects of the technology described herein may provide additional benefits to those now described.

Aspects of the present technology provide for a single substrate ultrasound device comprising space- and power-efficient circuitry for providing the desired waveforms to the ultrasonic transducers used to produce medically relevant ultrasound fields. The circuitry may be fully digitized in some embodiments, and may be integrated with the ultrasonic transducers on a single substrate, such as a CMOS substrate. The circuitry comprises a delay mesh which allows for the ultrasound device to have integrated thereon fewer waveform generators than ultrasonic transducers.

According to an aspect of the application, an apparatus is provided, comprising a substrate, a first ultrasound transmission unit integrated with the substrate, and delay mesh circuitry integrated with the substrate, coupled to an input of the first ultrasound transmission unit and configured to output to the first ultrasound transmission unit a time-delayed version of a delay mesh circuitry input signal corresponding to a waveform generated by a waveform generator. Various embodiments of this aspect are now described, which may be used individually or in any combination.

In one embodiment, the apparatus further comprises the waveform generator, and in some such embodiments the waveform generator is integrated with the substrate.

In one embodiment, the apparatus further comprises encoding circuitry integrated with the substrate. The encoding circuitry is configured to encode the waveform generated by the waveform generator to produce the delay mesh circuitry input signal. In some such embodiments, the waveform generator has an output coupled to an input of the encoding circuitry, and the encoding circuitry has an output coupled to an input of the delay mesh circuitry. In some embodiments, the encoding circuitry is configured to implement a N-to-M bit encoder, wherein each of N and M is a positive integer, and wherein N is greater than M. In some embodiments, the encoding circuitry is configured to implement a 2-to-1 bit encoder.

In one embodiment, the delay mesh circuitry is programmable.

In one embodiment, the delay mesh circuitry comprises a first delay mesh unit configured to receive a delay mesh unit control signal and a delay mesh unit input signal, and to delay the delay mesh unit input signal by an amount of time to produce a delay mesh unit output signal, the amount of time determined based at least in part on the delay mesh unit control signal. In some such embodiments, the delay mesh circuitry further comprises a plurality of delay mesh units coupled to the first delay mesh unit, the plurality of delay mesh units including at least a second delay mesh unit and a third delay mesh unit. The first delay mesh unit is further configured to receive the delay mesh unit input signal from the second delay mesh unit and to provide the delay mesh unit output signal to the third delay mesh unit.

In one embodiment, the first ultrasound transmission unit comprises at least one ultrasound element that comprises at least one ultrasonic transducer. In some such embodiments, the at least one ultrasound element comprises a plurality of ultrasound elements, each of the plurality of ultrasound elements comprising at least one ultrasonic transducer, and in some embodiments a plurality of ultrasonic transducers. The first ultrasound transmission unit comprises decoding circuitry configured to decode the time-delayed version of the delay mesh circuitry input signal to obtain a decoded waveform. The decoding circuitry is configured to implement an M-to-N bit decoder, wherein each of N and M is a positive integer, wherein M is less than N. In some embodiments the decoding circuitry is configured to implement a 1-to-2 bit decoder. In some embodiments, the at least one ultrasonic transducer is configured to transmit an ultrasound signal corresponding to the decoded waveform.

In one embodiment, the waveform generator is configurable to generate one or more of an impulse, a continuous wave, a coded excitation, or a chirp waveform. In some embodiments, the chirp waveform is a linear frequency modulation (LFM) chirp.

In one embodiment, the substrate is a complementary metal oxide semiconductor (CMOS) substrate.

In one embodiment, the apparatus further comprises a plurality of ultrasound transmission units integrated with the substrate, wherein the delay mesh circuitry is coupled to an input of each of the plurality of ultrasound transmission units. In some embodiments, the delay mesh circuitry is configured to output to each of the plurality of ultrasound transmission units a respective time-delayed version of the delay mesh circuitry input signal corresponding to a waveform generated by a waveform generator. In some embodiments, the delay mesh circuitry is configured to output, to the plurality of ultrasound transmission units, a plurality of time-delayed versions of the delay mesh circuitry input signal corresponding to a waveform generated by a waveform generator. In some embodiments, the plurality of ultrasound transmission units comprises a plurality of decoding circuits and a plurality of ultrasonic transducers, each of the plurality of ultrasound transmission units comprising at least one of the plurality of decoding circuits and at least one of the plurality of ultrasonic transducers. In some embodiments, the plurality of decoding circuits is configured to decode the plurality of time-delayed versions of the delay mesh circuitry input signal to obtain a plurality of decoded waveforms.

In some embodiments, the plurality of ultrasonic transducers is configured to generate an ultrasound field at least in part by transmitting ultrasound signals corresponding to the plurality of decoded waveforms. In some embodiments, the plurality of ultrasonic transducers is configured to generate the ultrasound field by transmitting ultrasound signals corresponding to two or more of the plurality of decoded waveforms in parallel. In some embodiments, the ultrasound field is a field having azimuthal symmetry, elevation symmetry, cylindrical symmetry, spherical symmetry, or is a plane wave field.

According to an aspect of the application, an apparatus is provided, comprising a substrate, a plurality of waveform generators integrated with the substrate, a plurality of ultrasound transmission units integrated with the substrate, and delay mesh circuitry integrated with the substrate. The delay mesh circuitry is coupled to inputs of the plurality of ultrasound transmission units and configured to output to the plurality of ultrasound transmission units a plurality of time-delayed versions of delay mesh circuitry input signals corresponding to a plurality of waveforms generated by the plurality of waveform generators. Various embodiments of this aspect are now described, which may be used individually or in any combination.

In one embodiment, the apparatus further comprises encoding circuitry integrated with the substrate and comprising a plurality of encoding circuits, wherein each of the encoding circuits is coupled to an output of at least one of the plurality of waveform generators. Each of the encoding circuits comprises an output coupled to an input of the delay mesh circuitry. In some embodiments, the encoding circuitry is configured to generate the delay mesh circuitry input signals at least in part by encoding the plurality of waveforms generated by the plurality of waveform generators, and to output the delay mesh circuitry input signals to the delay mesh circuitry.

In one embodiment, the plurality of ultrasound transmission units comprises a plurality of decoding circuits and a plurality of ultrasonic transducers, each of the plurality of ultrasound transmission units comprising at least one of the plurality of decoding circuits and at least one of the plurality of ultrasonic transducers. In some embodiments, the plurality of decoding circuits is configured to decode the plurality of time-delayed versions of the delay mesh circuitry input signal to obtain a plurality of decoded waveforms. In some embodiments, the plurality of ultrasonic transducers is configured to generate an ultrasound field at least in part by transmitting ultrasound signals corresponding to the plurality of decoded waveforms. In some embodiments, the plurality of ultrasonic transducers is configured to generate the ultrasound field by transmitting ultrasound signals corresponding to two or more of the plurality of decoded waveforms in parallel. In one embodiment, the ultrasound field is a field having azimuthal symmetry, elevation symmetry, cylindrical symmetry, spherical symmetry, or is a plane wave field.

In one embodiment, the delay mesh circuitry is programmable. In one embodiment, the delay mesh circuitry is reconfigurable. In some embodiments, the delay mesh circuitry is configured to be controlled by one or more delay mesh control signals.

According to an aspect of the application, an apparatus is provided, comprising a complementary metal oxide semiconductor (CMOS) substrate, at least one waveform generator integrated with the CMOS substrate and configured to generate at least one initial waveform, encoding circuitry integrated with the CMOS substrate, coupled to at least one output of the at least one waveform generator, and configured to encode the at least one initial waveform to produce at least one encoded waveform. The apparatus further comprises delay mesh circuitry integrated with the CMOS substrate, coupled to at least one output of the encoding circuitry, and configured to generate a plurality of time-delayed versions of the at least one encoded waveform. The apparatus further comprises a plurality of ultrasound transmission units integrated with the CMOS substrate and coupled to a plurality of outputs of the delay mesh circuitry. The plurality of ultrasound transmission units comprises decoding circuitry configured to decode the plurality of time-delayed versions of the at least one encoded waveform to produce a plurality of decoded waveforms, and a plurality of ultrasonic transducers configured to generate an ultrasound field at least in part by concurrently transmitting ultrasound signals corresponding to the plurality of decoded waveforms. Various embodiments of this aspect are now described, which may be used individually or in any combination.

In one embodiment, the at least one waveform generator comprises a plurality of waveform generators and the encoding circuitry comprises an encoding circuit for each of the plurality of waveform generators.

In one embodiment, the delay mesh circuitry is programmable. In one embodiment, the delay mesh circuitry is reconfigurable.

In one embodiment, the apparatus consists of fewer waveform generators than ultrasound transmission units. In one embodiment, the apparatus consists of at least twice as many, at least four times as many, at least eight times as many, at least sixteen times as many, at least thirty two times as many, or at least sixty four times as many ultrasound transmission units as waveform generators.

In one embodiment, the ultrasound field is a field having azimuthal symmetry, elevation symmetry, cylindrical symmetry, spherical symmetry, or is a plane wave field.

According to an aspect of the application, a method is provided, comprising using a single substrate ultrasound device to encode a waveform generated by a waveform generator to obtain an encoded waveform, produce a plurality of time-delayed versions of the encoded waveform, decode the plurality of time-delayed versions of the encoded waveform to obtain a plurality of decoded waveforms, and generate an ultrasound field at least in part by transmitting in parallel, using a plurality of ultrasound elements, ultrasound signals corresponding to the plurality of decoded waveforms. Various embodiments of this aspect are now described, which may be used individually or in any combination.

In one embodiment, the waveform generator is integrated with the single substrate ultrasound device, and the method further comprises generating the waveform.

In one embodiment, encoding the waveform comprises using a 2-to-1 bit encoder.

In one embodiment, decoding the plurality of time-delayed versions of the encoded waveform comprises using at least one 1-to-2 bit decoder.

In one embodiment, the ultrasound field is a field having azimuthal symmetry, elevation symmetry, cylindrical symmetry, spherical symmetry, or is a plane wave field.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Elements other than those specifically identified by the "and/or" clause may optionally be present, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus, comprising:
a plurality of ultrasound transmission units; and
a delay mesh circuitry configured to output to the plurality of ultrasound transmission units a plurality of time-delayed versions of a single delay mesh circuitry input signal,
wherein the delay mesh circuitry comprises at least a first delay unit and a second delay unit, wherein the first and second delay units are interconnected such that the first delay unit is configured to receive an input signal from and provide an output signal to the second delay unit.

2. The apparatus of claim 1, further comprising:
a substrate,
wherein the plurality of ultrasound transmission units is integrated with the substrate.

3. The apparatus of claim 2, wherein the delay mesh circuitry is integrated with the substrate.

4. The apparatus of claim 2, further comprising:
a waveform generator integrated with the substrate and configured to generate an initial waveform,
encoding circuitry integrated with the substrate, coupled to at least one output of the waveform generator, and configured to encode the initial waveform to produce the single delay mesh circuitry input signal, and
wherein the plurality of ultrasound transmission units comprises:
decoding circuitry configured to decode the plurality of time-delayed versions of the single delay mesh circuitry input signal to produce a plurality of decoded waveforms, and
a plurality of ultrasonic transducers configured to generate an ultrasound field at least in part by concurrently transmitting ultrasound signals corresponding to the plurality of decoded waveforms.

5. The apparatus of claim 2, wherein the substrate comprises a complementary metal oxide semiconductor (CMOS) substrate.

6. The apparatus of claim 2, further comprising:
a waveform generator integrated with the substrate and having an output coupled to an input of encoding circuitry; and
the encoding circuitry integrated with the substrate and having an output coupled to an input of the delay mesh circuitry.

7. The apparatus of claim 6, wherein the encoding circuitry is further configured to:
generate the single delay mesh circuitry input signal at least in part by encoding a single waveform generated by the waveform generator; and
output the single delay mesh circuitry input signal to the delay mesh circuitry.

8. The apparatus of claim 1, wherein the plurality of ultrasound transmission units comprises a plurality of decoding circuits and a plurality of ultrasonic transducers, each of the plurality of ultrasound transmission units comprising at least one of the plurality of decoding circuits and at least one of the plurality of ultrasonic transducers.

9. The apparatus of claim 8, wherein at least one of the plurality of decoding circuits is configured to decode at least one of the plurality of time-delayed versions of the single delay mesh circuitry input signal to obtain a plurality of decoded waveforms.

10. The apparatus of claim 9, wherein the plurality of ultrasonic transducers is configured to generate an ultrasound field at least in part by transmitting ultrasound signals corresponding to the plurality of decoded waveforms.

11. The apparatus of claim 10, wherein the plurality of ultrasonic transducers is further configured to generate the ultrasound field by transmitting ultrasound signals corresponding to two or more of the plurality of decoded waveforms in parallel.

12. The apparatus of claim 1, wherein the plurality of ultrasonic transducers is configured to generate an ultrasound field having azimuthal symmetry by transmitting ultrasound signals obtained based on the plurality of time-delayed versions of the single delay mesh circuitry input signal.

13. The apparatus of claim 1, wherein the plurality of ultrasonic transducers is configured to generate an ultrasound field having elevation symmetry by transmitting ultrasound signals obtained based on the plurality of time-delayed versions of the single delay mesh circuitry input signal.

14. The apparatus of claim 1, wherein the plurality of ultrasonic transducers is configured to generate an ultrasound field having cylindrical symmetry by transmitting ultrasound signals obtained based on the plurality of time-delayed versions of the single delay mesh circuitry input signal.

15. The apparatus of claim 1, wherein the plurality of ultrasonic transducers is configured to generate an ultrasound field having spherical symmetry by transmitting ultrasound signals obtained based on the plurality of time-delayed versions of the single delay mesh circuitry input signal.

16. The apparatus of claim 1, wherein the plurality of ultrasonic transducers is configured to generate a plane wave ultrasound field by transmitting ultrasound signals obtained based on the plurality of time-delayed versions of the single delay mesh circuitry input signal.

17. The apparatus of claim 1, wherein the delay mesh circuitry is programmable.

18. The apparatus of claim 1, wherein the delay mesh circuitry is reconfigurable.

19. The apparatus of claim 1, wherein the delay mesh circuitry is further configured to:
- in response to input of a first delay mesh control signal, output to the plurality of ultrasound transmission units the plurality of time-delayed versions of the single delay mesh circuitry input signal; and
- in response to input of a second delay mesh control signal different from the first delay mesh control signal, output to the plurality of ultrasound transmission units a second plurality of time-delayed versions of the single delay mesh circuitry input signal,
- wherein the plurality of time-delayed versions of the delay mesh circuitry input signal is different from the second plurality of time delayed versions of the single delay mesh circuitry input signal.

20. The apparatus of claim 19, wherein the plurality of ultrasound transmission units comprises a plurality of decoding circuits and a plurality of ultrasonic transducers, each of the plurality of ultrasound transmission units comprising at least one of the plurality of decoding circuits and at least one of the plurality of ultrasonic transducers.

21. The apparatus of claim 20, wherein the plurality of decoding circuits is configured to decode the plurality of time-delayed versions of the single delay mesh circuitry input signal to obtain a first plurality of decoded waveforms and is further configured to decode the second plurality of time-delayed versions of the single delay mesh circuitry input signal to obtain a second plurality of decoded waveforms.

22. The apparatus of claim 21, wherein the plurality of ultrasonic transducers is configured to generate a first ultrasound field at least in part by transmitting ultrasound signals corresponding to the first plurality of decoded waveforms and to generate a second ultrasound field at least in part by transmitting ultrasound signals corresponding to the second plurality of decoded waveforms, wherein the first ultrasound field is a different type of field than the second ultrasound field.

23. The apparatus of claim 1, wherein the apparatus consists of fewer waveform generators than ultrasound transmission units.

24. A delay circuit configured to receive an input waveform and generate a plurality of output waveforms, the delay circuit comprising:
- a delay circuit controller configured to output a control signal; and
- a plurality of interconnected delay units, at least one of the plurality of interconnected delay units comprising a control signal input configured to receive the control signal, and wherein the at least one of the plurality of interconnected delay units is configured to select an output path from among a plurality of possible output paths based on the control signal.

25. The delay circuit of claim 24, wherein the at least one of the plurality of interconnected delay units is further configured to select an input path from among a plurality of possible input paths based on the control signal.

26. The delay circuit of claim 25, wherein the delay circuit controller is configured to output a first control signal for generating a first plurality of output waveforms from an input signal on the input path selected from among the plurality of possible input paths.

27. The delay circuit of claim 24, wherein the at least one of the plurality of interconnected delay units is further configured to select a delay period based on the control signal.

28. The delay circuit of claim 24, wherein the delay circuit is integrated on a substrate, and wherein the delay circuit is configured to receive the input waveform from a waveform generator integrated with the substrate, and wherein the delay circuit is further configured to output the plurality of output waveforms to a plurality of ultrasound transmission units integrated with the substrate.

* * * * *